(12) United States Patent
Dalmia et al.

(10) Patent No.: US 12,068,525 B2
(45) Date of Patent: *Aug. 20, 2024

(54) INTEGRATED CIRCUIT PACKAGES, ANTENNA MODULES, AND COMMUNICATION DEVICES

(71) Applicant: Intel Corporation, Santa Clara, CA (US)

(72) Inventors: Sidharth Dalmia, Portland, OR (US); Trang Thai, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/938,768

(22) Filed: Oct. 7, 2022

(65) Prior Publication Data
US 2023/0035608 A1 Feb. 2, 2023

Related U.S. Application Data

(63) Continuation of application No. 15/991,295, filed on May 29, 2018, now Pat. No. 11,509,037.

(51) Int. Cl.
*H01Q 1/22* (2006.01)
*H01L 23/66* (2006.01)
(Continued)

(52) U.S. Cl.
CPC .......... *H01Q 1/2283* (2013.01); *H01L 23/66* (2013.01); *H01Q 9/0407* (2013.01);
(Continued)

(58) Field of Classification Search
CPC .. H01Q 1/2283; H01Q 9/0407; H01Q 21/065; H01L 23/66; H01L 2223/6677; H01L 2924/1421; H01L 2924/15153; H01L 2924/15311; H01L 24/13; H01L 24/16; H01L 2224/0401; H01L 2224/131;
(Continued)

(56) References Cited

U.S. PATENT DOCUMENTS 6,008,763 A   12/1999  Nystrom et al.
7,265,719 B1   9/2007  Moosbrugger et al.
(Continued)

FOREIGN PATENT DOCUMENTS

CN   107534223 A   1/2018
JP   2010538542 A   12/2010
(Continued)

OTHER PUBLICATIONS

"Flexible flat cable", Wikipedia, https://en.wikipedia.org/wiki/Flexible_flat_cable, retrieved from the internet on Apr. 9, 2024, 3 pages.

*Primary Examiner* — David E Lotter
(74) *Attorney, Agent, or Firm* — Akona IP PC

(57) ABSTRACT

Disclosed herein are antenna boards, integrated circuit (IC) packages, antenna modules, and communication devices. For example, in some embodiments, an antenna module may include: an IC package having a die and a package substrate, and the package substrate has a recess therein; and an antenna patch, coupled to the package substrate, such that the antenna patch is over or at least partially in the recess.

20 Claims, 18 Drawing Sheets

(51) Int. Cl.
*H01Q 9/04* (2006.01)
*H01Q 21/06* (2006.01)

(52) U.S. Cl.
CPC ... *H01Q 21/065* (2013.01); *H01L 2223/6677* (2013.01); *H01L 2924/1421* (2013.01); *H01L 2924/15153* (2013.01); *H01L 2924/15311* (2013.01)

(58) Field of Classification Search
CPC . H01L 2224/16227; H01L 2224/16235; H01L 2924/15159; H01L 2924/15313; H01L 2924/19041; H01L 2924/19042; H01L 2924/19043; H01L 2924/19105; H01L 2924/3025
See application file for complete search history.

(56) References Cited

U.S. PATENT DOCUMENTS

| | | | |
|---|---|---|---|
| 9,196,965 | B2 | 11/2015 | Sabielny |
| 9,620,464 | B2 | 4/2017 | Baks et al. |
| 2002/0124392 | A1 | 9/2002 | Chung |
| 2004/0090369 | A1 | 5/2004 | Mccarrick |
| 2004/0227683 | A1 | 11/2004 | Caimi et al. |
| 2007/0159380 | A1 | 7/2007 | Nagaishi et al. |
| 2007/0200146 | A1 | 8/2007 | Onishi et al. |
| 2009/0303135 | A1 | 12/2009 | Reed et al. |
| 2010/0164783 | A1 | 7/2010 | Choudhury et al. |
| 2010/0327068 | A1 | 12/2010 | Chen et al. |
| 2013/0189935 | A1 | 7/2013 | Nair et al. |
| 2015/0123744 | A1 | 5/2015 | Nishimura et al. |
| 2015/0129668 | A1 | 5/2015 | Kam et al. |
| 2015/0234035 | A1 | 8/2015 | Lohoefener et al. |
| 2016/0049723 | A1* | 2/2016 | Baks ............... H01Q 9/0457 343/848 |
| 2016/0261047 | A1 | 9/2016 | Wallace et al. |
| 2016/0308563 | A1 | 10/2016 | Ouyang et al. |
| 2017/0125895 | A1 | 5/2017 | Baks et al. |
| 2017/0179612 | A1 | 6/2017 | Kamgaing et al. |
| 2017/0250120 | A1 | 8/2017 | Harauchi et al. |
| 2018/0005957 | A1 | 1/2018 | Vincent et al. |
| 2018/0026341 | A1 | 1/2018 | Mow et al. |
| 2018/0048050 | A1 | 2/2018 | Sayem et al. |
| 2018/0090816 | A1* | 3/2018 | Mow ............... H01Q 9/0421 |
| 2019/0020114 | A1 | 1/2019 | Paulotto et al. |
| 2019/0103653 | A1 | 4/2019 | Jeong et al. |
| 2019/0333882 | A1 | 10/2019 | Kamgaing et al. |
| 2020/0266549 | A1 | 8/2020 | Yamamoto |
| 2022/0246571 | A1 | 8/2022 | Zhu et al. |

FOREIGN PATENT DOCUMENTS

| | | |
|---|---|---|
| JP | 2018032890 A | 3/2018 |
| TW | 200952251 A | 12/2009 |
| TW | 201340629 A | 10/2013 |
| TW | 201433003 A | 8/2014 |
| TW | I463736 B | 12/2014 |
| TW | 201622076 A | 6/2016 |
| TW | 201707179 A | 2/2017 |
| TW | 201724417 A | 7/2017 |
| TW | 201743415 A | 12/2017 |
| WO | 2018230475 A1 | 12/2018 |

* cited by examiner

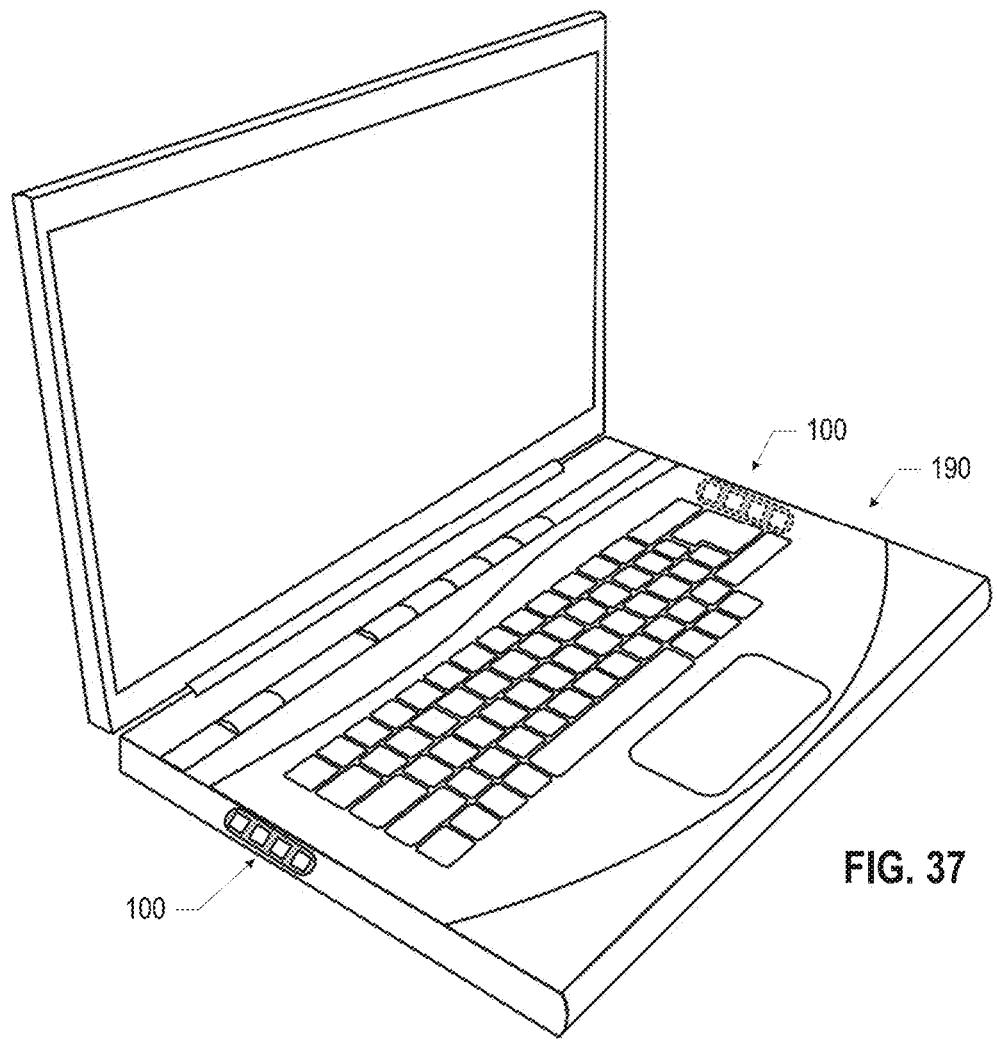
FIG. 37
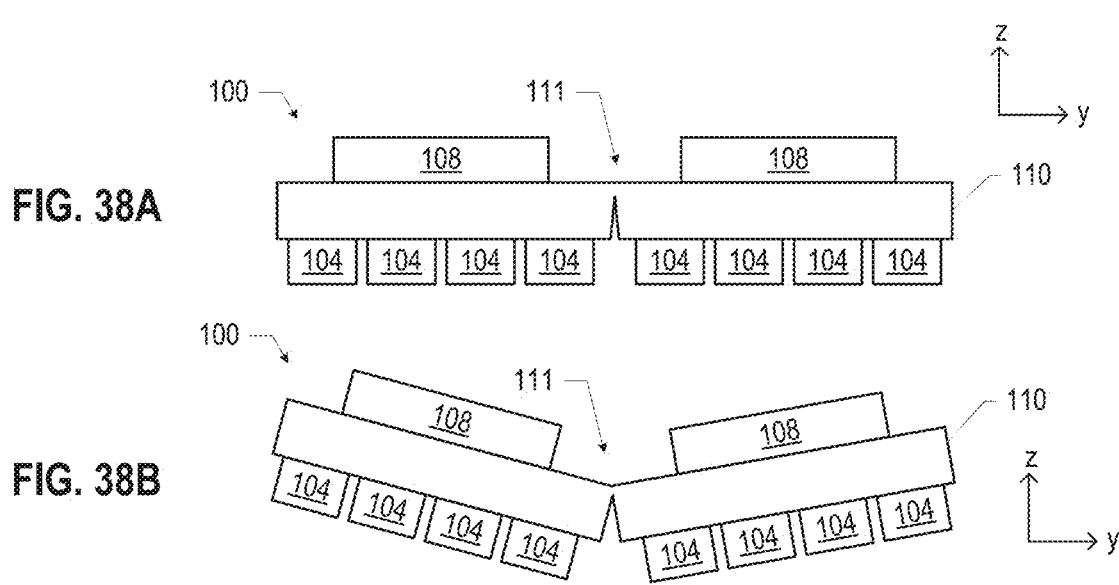
FIG. 38A
FIG. 38B

INTEGRATED CIRCUIT PACKAGES, ANTENNA MODULES, AND COMMUNICATION DEVICES

This Application is a continuation and claims the benefit of priority under 35 U.S.C. § 120 of U.S. application Ser. No. 15/991,295, filed May 29, 2018, and entitled INTEGRATED CIRCUIT PACKAGES, ANTENNA MODULES, AND COMMUNICATION DEVICES. The disclosure of the prior application is considered part of and is incorporated by reference in the disclosure of this Application,

BACKGROUND

Wireless communication devices, such as handheld computing devices and wireless access points, include antennas. The frequencies over which communication may occur may depend on the shape and arrangement of an antenna or antenna array, among other factors.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIG. 37 is a perspective view of a laptop communication device including multiple antenna modules, in accordance with various embodiments.

FIGS. 38A and 38B are side, cross-sectional views of example antenna modules, in accordance with various embodiments.

DETAILED DESCRIPTION

Figure 1:
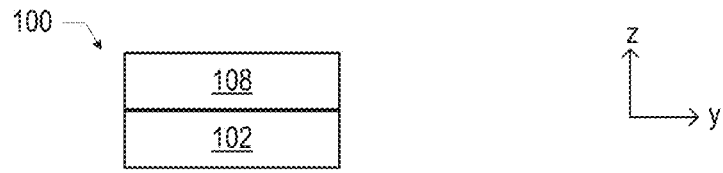
FIG. 1 is a side, cross-sectional view of an antenna module, in accordance with various embodiments.

Conventional antenna arrays for millimeter wave applications have utilized circuit boards with more than 14 (e.g., more than 18) layers of dielectric/metal stack-up to achieve a desired performance. Such boards are typically expensive and low yield, as well as unbalanced in their metal density and dielectric thickness. Further, such boards may be difficult to test, and may not be readily capable of incorporating the shielding required to achieve regulatory compliance.

Disclosed herein are antenna boards, integrated circuit (IC) packages, antenna modules, and communication devices that may enable millimeter wave communications in a compact form factor. In some of the embodiments disclosed herein, an antenna module may include an antenna board and one or more IC packages that may be separately fabricated and assembled, enabling increased degrees of design freedom and improved yield. Various ones of the antenna modules disclosed herein may exhibit little to no warpage during operation or installation, ease of assembly, low cost, fast time to market, good mechanical handling, and/or good thermal performance. Various ones of the antenna modules disclosed herein may allow different antennas and/or IC packages to be swapped into an existing module.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense. Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 29" may be used to refer to the collection of drawings of FIGS. 29A-29B, the phrase "FIG. 35" may be used to refer to the collection of drawings of FIGS. 35A-35B, etc.

Any of the features discussed with reference to any of accompanying drawings herein may be combined with any other features to form an antenna board 102, an antenna module 100, or a communication device, as appropriate. A number of elements of the drawings are shared with others of the drawings; for ease of discussion, a description of these elements is not repeated, and these elements may take the form of any of the embodiments disclosed herein.

FIG. 1 is a side, cross-sectional view of an antenna module 100, in accordance with various embodiments. The antenna module 100 may include an IC package 108 coupled to an antenna board 102. Although a single IC package 108 is illustrated in FIG. 1, an antenna module 100 may include more than one IC package 108 (e.g., as discussed below with reference to FIGS. 32-35). As discussed in further detail below, the antenna board 102 may include conductive pathways (e.g., provided by conductive vias and lines through one or more dielectric materials) and radio frequency (RF) transmission structures (e.g., antenna feed structures, such as striplines, microstriplines, or coplanar waveguides) that may enable one or more antenna units 104 (not shown) to transmit and receive electromagnetic waves under the control of circuitry in the IC package 108. In some embodiments, the IC package 108 may be coupled to the antenna board 102 by second-level interconnects (not shown, but discussed below with reference to FIG. 14). In some embodiments, at least a portion of the antenna board 102 may be fabricated using printed circuit board (PCB) technology, and may include between two and eight PCB layers. Examples of IC packages 108 and antenna boards 102 are discussed in detail below. In some embodiments, an antenna module 100 may include a different IC package 108 for controlling each different antenna unit 104; in other embodiments, an antenna module 100 may include one IC package 108 having circuitry to control multiple antenna units 104. In some embodiments, the total z-height of an antenna module 100 may be less than 3 millimeters (e.g., between 2 millimeters and 3 millimeters).

Figure 2:
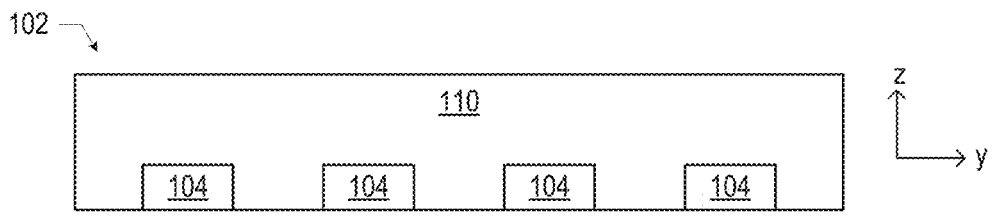
FIGS. 2-4 are side, cross-sectional views of example antenna boards, in accordance with various embodiments.
Figure 3:
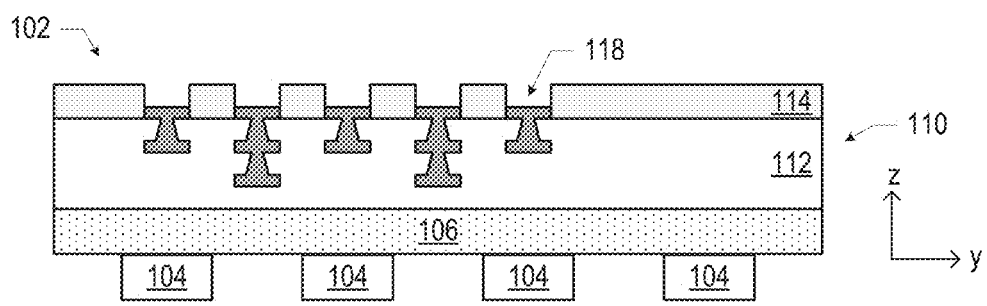
Figure 4:
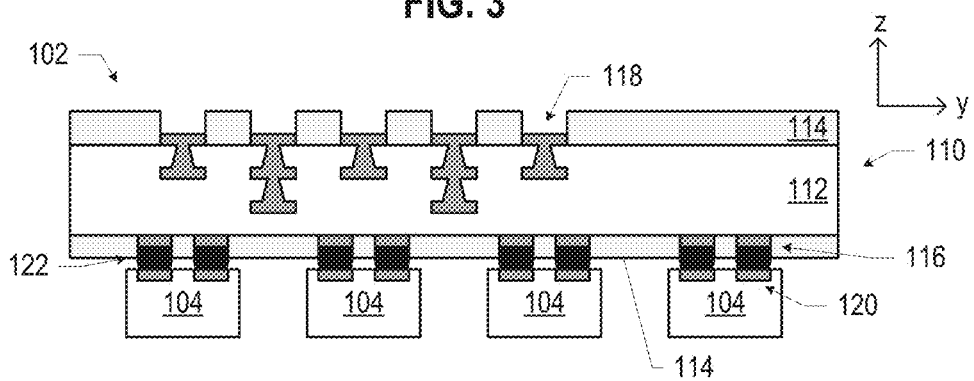

FIGS. 2-4 are side, cross-sectional views of example antenna boards 102, in accordance with various embodiments. FIG. 2 is a generalized representation of an example antenna board 102 including one or more antenna units 104 coupled to an antenna patch support 110. In some embodiments, the antenna units 104 may be electrically coupled to the antenna patch support 110 by electrically conductive material pathways through the antenna patch support 110 that makes conductive contact with electrically conductive material of the antenna units 104, while in other embodiments, the antenna units 104 may be mechanically coupled to the antenna patch support 110 but may not be in contact with an electrically conductive material pathway through the antenna patch support 110. In some embodiments, at least a portion of the antenna patch support 110 may be fabricated using PCB technology, and may include between two and eight PCB layers. Although a particular number of antenna units 104 is depicted in FIG. 2 (and others of the accompanying drawings), this is simply illustrative, and an antenna board 102 may include fewer or more antenna units 104. For example, an antenna board 102 may include four antenna units 104 (e.g., arranged in a linear array, as discussed below with reference to FIGS. 27-29 and 37), eight antenna units 104 (e.g., arranged in one linear array, or two linear arrays as discussed below with reference to FIGS. 33, 35, and 36), sixteen antenna units 104 (e.g., arranged in a 4×4 array, as discussed below with reference to FIGS. 32 and 34), or thirty-two antenna units 104 (e.g., arranged in two 4×4 arrays, as discussed below with reference to FIGS. 32 and 34). In some embodiments, the antenna units 104 may be surface mount components.

In some embodiments, an antenna module 100 may include one or more arrays of antenna units 104 to support multiple communication bands (e.g., dual band operation or tri-band operation). For example, some of the antenna modules 100 disclosed herein may support tri-band operation at 28 gigahertz, 39 gigahertz, and 60 gigahertz. Various ones of the antenna modules 100 disclosed herein may support tri-band operation at 24.5 gigahertz to 29 gigahertz, 37 gigahertz to 43 gigahertz, and 57 gigahertz to 71 gigahertz. Various ones of the antenna modules 100 disclosed herein may support 5G communications and 60 gigahertz communications. Various ones of the antenna modules 100 disclosed herein may support 28 gigahertz and 39 gigahertz communications. Various of the antenna modules 100 disclosed herein may support millimeter wave communications. Various of the antenna modules 100 disclosed herein may support high band frequencies and low band frequencies.

In some embodiments, an antenna board 102 may include an antenna unit 104 coupled to an antenna patch support 110 by an adhesive. FIG. 3 illustrates an antenna board 102 in which the antenna patch support 110 includes a circuit board 112 (e.g., including between two and eight PCB layers), a solder resist 114 and conductive contacts 118 at one face of the circuit board 112, and an adhesive 106 at the opposite face of the circuit board 112. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket). The circuit board 112 may include traces, vias, and other structures, as known in the art, formed of an electrically conductive material (e.g., a metal, such as copper). The conductive structures in the circuit board 112 may be electrically insulated from each other by a dielectric material. Any suitable dielectric material may be used (e.g., a laminate material). In some embodiments, the dielectric material may be an organic dielectric material, a fire retardant grade 4 material (FR-4), bismaleimide triazine (BT) resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics).

In the embodiment of FIG. 3, the antenna units 104 may be adhered to the adhesive 106. The adhesive 106 may be electrically non-conductive, and thus the antenna units 104 may not be electrically coupled to the circuit board 112 by an electrically conductive material pathway. In some embodiments, the adhesive 106 may be an epoxy. The thickness of the adhesive 106 may control the distance between the antenna units 104 and the proximate face of the circuit board 112. When the antenna board 102 of FIG. 3 (and others of the accompanying drawings) is used in an antenna module 100, an IC package 108 may be coupled to some of the conductive contacts 118. In some embodiments, a thickness of the circuit board 112 of FIG. 3 may be less than 1 millimeter (e.g., between 0.35 millimeters and 0.5 millimeters). In some embodiments, a thickness of an antenna unit 104 may be less than 1 millimeter (e.g., between 0.4 millimeters and 0.7 millimeters).

Figure 5:
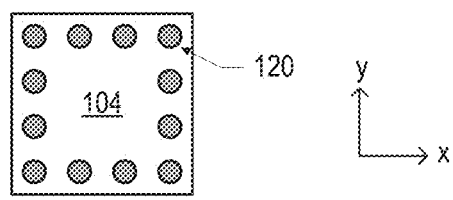
FIG. 5 is a top view of an example antenna patch, in accordance with various embodiments.

In some embodiments, an antenna board 102 may include an antenna unit 104 coupled to an antenna patch support 110 by solder. FIG. 4 illustrates an antenna board 102 in which the antenna patch support 110 includes a circuit board 112 (e.g., including between two and eight PCB layers), a solder resist 114 and conductive contacts 118 at one face of the circuit board 112, and a solder resist 114 and conductive contacts 116 at the opposite face of the circuit board 112. The antenna units 104 may be secured to the circuit board 112 by solder 122 (or other second-level interconnects) between conductive contacts 120 of the antenna units 104 and the conductive contacts 116. In some embodiments, the conductive contacts 116/solder 122/conductive contacts 120 may provide an electrically conductive material pathway through which signals may be transmitted to or from the antenna units 104. In other embodiments, the conductive contacts 116/solder 122/conductive contacts 120 may be used only for mechanical coupling between the antenna units 104 and the antenna patch support 110. The height of the solder 122 (or other interconnects) may control the distance between the antenna units 104 and the proximate face of the circuit board 112. FIG. 5 is a top view of an example antenna unit 104 that may be used in an antenna board 102 like the antenna board 102 of FIG. 4, in accordance with various embodiments. The antenna unit 104 of FIG. 5 may have a number of conductive contacts 120 distributed regularly on one face, close to the edges; other antenna units 104 with conductive contacts 120 may have other arrangements of the conductive contacts 120.

Figure 6:
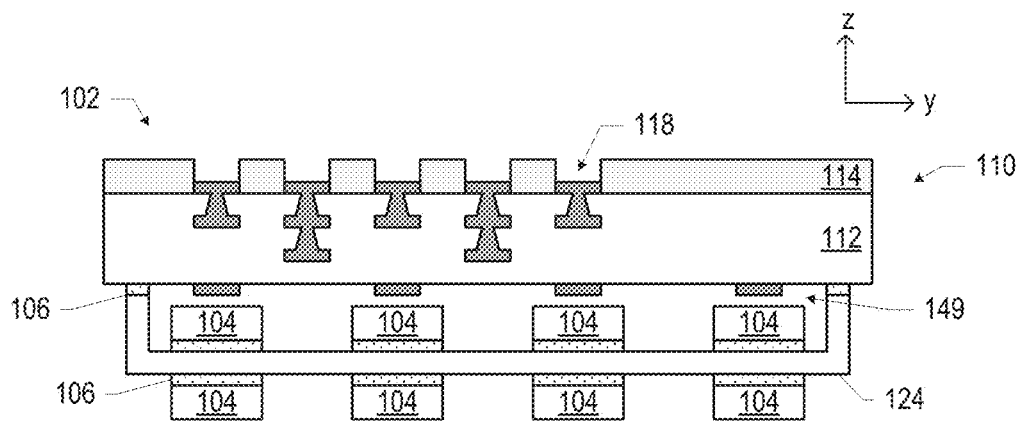
FIGS. 6-11 are side, cross-sectional views of example antenna boards, in accordance with various embodiments.

In some embodiments, an antenna board may include an antenna unit 104 coupled to a bridge structure. FIG. 6 illustrates an antenna board 102 in which the antenna patch support 110 includes a circuit board 112 (e.g., including between two and eight PCB layers), a solder resist 114 and conductive contacts 118 at one face of the circuit board 112, and a bridge structure 124 secured to the opposite face of the circuit board 112. The bridge structure 124 may have one or more antenna units 104 coupled to an interior face of the bridge structure 124, and one or more antenna units 104 coupled to an exterior face of the bridge structure 124. In the embodiment of FIG. 6, the antenna units 104 are coupled to the bridge structures 124 by an adhesive 106. In the embodiment of FIG. 6, the bridge structure 124 may be coupled to the circuit board 112 by an adhesive 106. The thickness of the adhesive 106 and the dimensions of the bridge structure 124 (i.e., the distance between the interior face and the proximate face of the circuit board 112, and the thickness of the bridge structure 124 between the interior face and the exterior face) may control the distance between the antenna units 104 and the proximate face of the circuit board 112 (including the distance between the "interior" antenna units 104 and the "exterior" antenna units 104). The bridge structure 124 may be formed of any suitable material; for example, the bridge structure 124 may be formed of a non-conductive plastic. In some embodiments, the bridge structure 124 of FIG. 6 may be manufactured using three-dimensional printing techniques. In some embodiments, the bridge structure 124 of FIG. 6 may be manufactured as a PCB with a recess defining the interior face (e.g., using recessed board manufacturing technology). In the embodiment of FIG. 6, the bridge structure 124 may introduce an air cavity 149 between the antenna units 104 and the circuit board 112, enhancing the bandwidth of the antenna module 100.

Figure 7:
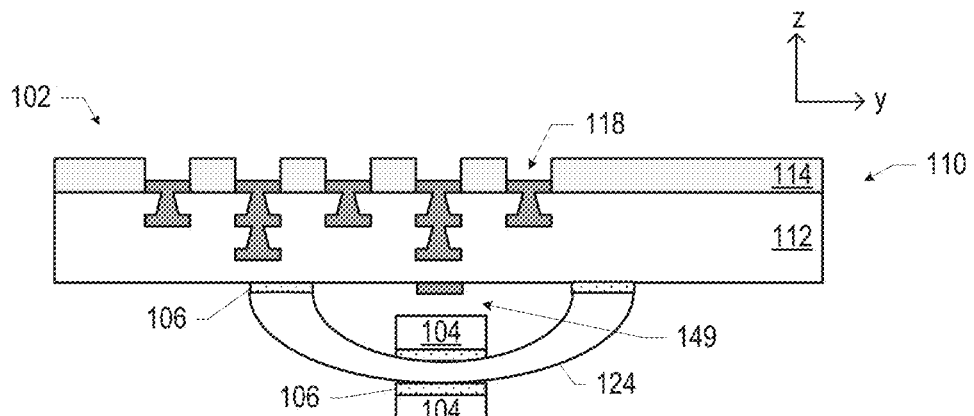

FIG. 7 illustrates an antenna board 102 similar to the antenna board 102 of FIG. 6, but in which the bridge structure 124 is curved (e.g., has the shape of an arch). Such a bridge structure 124 may be formed from a flexible plastic or other material, for example. In the antenna board 102 of FIG. 7, the antenna patch support 110 includes a circuit board 112 (e.g., including between two and eight PCB layers), a solder resist 114 and conductive contacts 118 at one face of the circuit board 112, and a bridge structure 124 secured to the opposite face of the circuit board 112. The bridge structure 124 may have one or more antenna units 104 coupled to an interior face of the bridge structure 124, and one or more antenna units 104 coupled to an exterior face of the bridge structure 124. In the embodiment of FIG. 7, the antenna units 104 are coupled to the bridge structures 124 by an adhesive 106. In the embodiment of FIG. 6, the bridge structure 124 may be coupled to the circuit board 112 by an adhesive 106. The thickness of the adhesive 106 and the dimensions of the bridge structure 124 (i.e., the distance between the interior face and the proximate face of the circuit board 112, and the thickness of the bridge structure 124 between the interior face and the exterior face) may control the distance between the antenna units 104 and the proximate face of the circuit board 112 (including the distance between the "interior" antenna units 104 and the "exterior" antenna units 104). The bridge structure 124 of FIG. 7 may be formed of any suitable material; for example, the bridge structure 124 may be formed of a non-conductive plastic. In the embodiment of FIG. 7, the bridge structure 124 may introduce an air cavity 149 between the antenna units 104 and the circuit board 112, enhancing the bandwidth of the antenna module 100.

Figure 8:
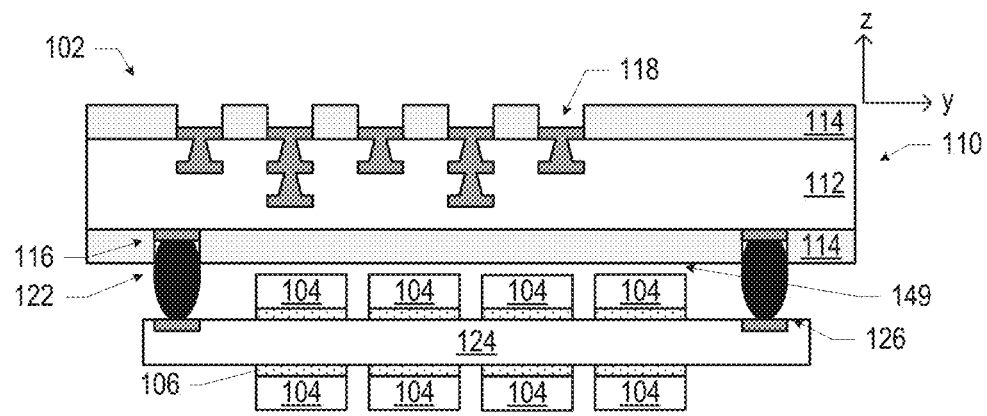

FIG. 8 illustrates an antenna board 102 similar to the antenna board 102 of FIGS. 6 and 7, but in which the bridge structure 124 is itself a planar circuit board or other structure with conductive contacts 126; the bridge structure 124 may be coupled to the circuit board 112 by solder 122 (or other interconnects) between the conductive contacts 126 and the conductive contacts 116 on the circuit board 112. In the antenna board 102 of FIG. 8, the antenna patch support 110 includes a circuit board 112 (e.g., including between two and eight PCB layers), a solder resist 114 and conductive contacts 118 at one face of the circuit board 112, and a bridge structure 124 secured to the opposite face of the circuit board 112. The bridge structure 124 may have one or more antenna units 104 coupled to an interior face of the bridge structure 124, and one or more antenna units 104 coupled to an exterior face of the bridge structure 124. In the embodiment of FIG. 8, the antenna units 104 are coupled to the bridge structures 124 by an adhesive 106. The thickness of the adhesive 106, the height of the solder 122, and the dimensions of the bridge structure 124 (i.e., the thickness of the bridge structure 124 between the interior face and the exterior face) may control the distance between the antenna units 104 and the proximate face of the circuit board 112 (including the distance between the "interior" antenna units 104 and the "exterior" antenna units 104). The bridge structure 124 of FIG. 8 may be formed of any suitable material; for example, the bridge structure 124 may be formed of a non-conductive plastic or a PCB. In the embodiment of FIG. 8, the bridge structure 124 may introduce an air cavity 149 between the antenna units 104 and the circuit board 112, enhancing the bandwidth of the antenna module 100.

Figure 9:
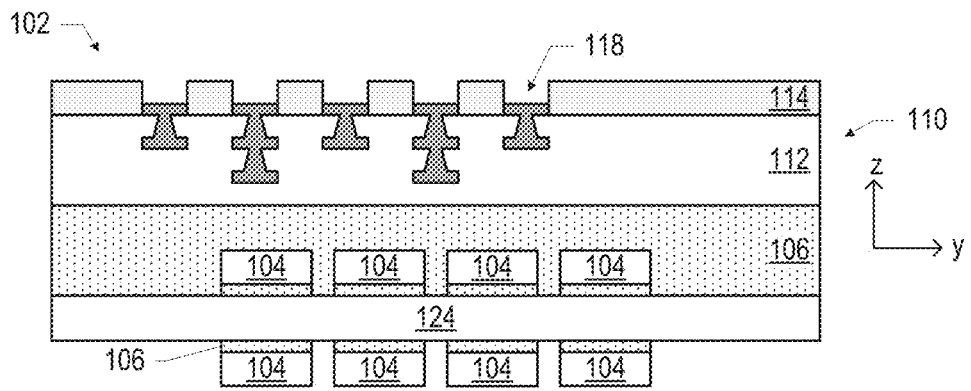

FIG. 9 illustrates an antenna board 102 similar to the antenna board 102 of FIG. 8, but in which the bridge structure 124 is itself a planar circuit board or other structure, and the bridge structure 124 and the antenna units 104 coupled thereto are all coupled to the circuit board 112 by an adhesive 106. In the antenna board 102 of FIG. 9, the antenna patch support 110 includes a circuit board 112 (e.g., including between two and eight PCB layers), a solder resist 114 and conductive contacts 118 at one face of the circuit board 112, and a bridge structure 124 secured to the opposite face of the circuit board 112. The bridge structure 124 may have one or more antenna units 104 coupled to an interior face of the bridge structure 124, and one or more antenna units 104 coupled to an exterior face of the bridge structure 124. In the embodiment of FIG. 9, the antenna units 104 are coupled to the bridge structures 124 by an adhesive 106. The thickness of the adhesive 106 and the dimensions of the bridge structure 124 (i.e., the thickness of the bridge structure 124 between the interior face and the exterior face) may control the distance between the antenna units 104 and the proximate face of the circuit board 112 (including the distance between the "interior" antenna units 104 and the "exterior" antenna units 104). The bridge structure 124 of FIG. 9 may be formed of any suitable material; for example, the bridge structure 124 may be formed of a non-conductive plastic or a PCB. In some embodiments, the circuit board 112 may be a 1-2-1 cored board, and the bridge structure 124 may be a 0-2-0 cored board. In some embodiments, the circuit board 112 may use a dielectric material different from a dielectric material of the bridge structure 124 (e.g., the bridge structure 124 may include polytetrafluoroethylene (PTFE) or a PTFE-based formula), and the circuit board 112 may include another dielectric material).

Figure 10:
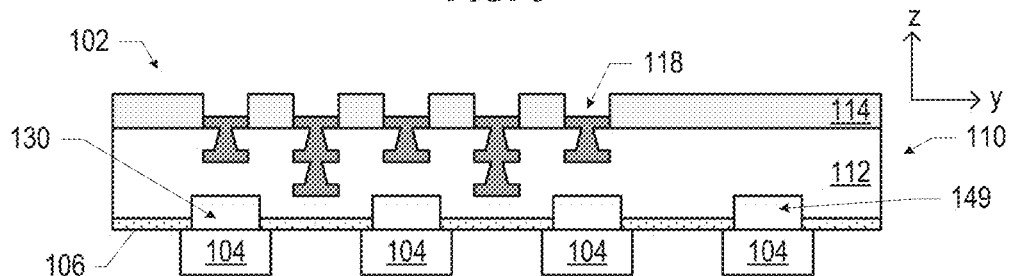

In some embodiments, an antenna board 102 may include recesses "above" the antenna patches 104 to provide an air cavity 149 between the antenna patches 104 and other portions of the antenna board 102. FIG. 10 illustrates an antenna board 102 similar to the antenna board 102 of FIG. 3, but in which the circuit board 112 includes recesses 130 positioned "above" each of the antenna units 104. These recesses 130 may provide air cavitys 149 between the antenna units 104 and the rest of the antenna board 102, which may improve performance. In the embodiment of FIG. 10, the antenna patch support 110 includes a circuit board 112 (e.g., including between two and eight PCB layers), a solder resist 114 and conductive contacts 118 at one face of the circuit board 112, and an adhesive 106 at the opposite face of the circuit board 112. The antenna units 104 may be adhered to the adhesive 106. The adhesive 106 may be electrically non-conductive, and thus the antenna units 104 may not be electrically coupled to the circuit board 112 by an electrically conductive material pathway. In some embodiments, the adhesive 106 may be an epoxy. The thickness of the adhesive 106 may control the distance between the antenna units 104 and the proximate face of the circuit board 112. In some embodiments, the recesses 130 may have a depth between 200 microns and 400 microns.

Figure 11:
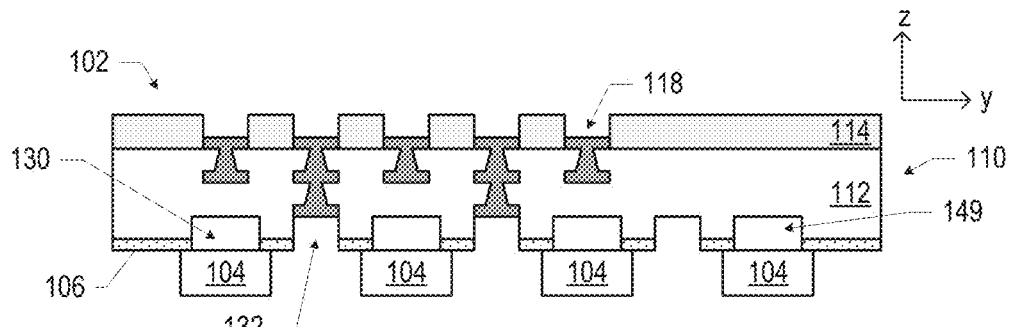

In some embodiments, an antenna board 102 may include recesses that are not "above" the antenna patches 104, but that are located between the attachment locations of different ones of the antenna units 104 to the circuit board 112. For example, FIG. 11 illustrates an antenna board 102 similar to the antenna board 102 of FIG. 10, but in which the circuit board 112 includes additional recesses 132 positioned "between" each of the antenna units 104. These recesses 132 may help isolate different ones of the antenna units 104 from each other, thereby improving performance. In the embodiment of FIG. 11, the antenna patch support 110 includes a circuit board 112 (e.g., including between two and eight PCB layers), a solder resist 114 and conductive contacts 118 at one face of the circuit board 112, and an adhesive 106 at the opposite face of the circuit board 112. The antenna units 104 may be adhered to the adhesive 106. The adhesive 106 may be electrically non-conductive, and thus the antenna units 104 may not be electrically coupled to the circuit board 112 by an electrically conductive material pathway. In some embodiments, the adhesive 106 may be an epoxy. The thickness of the adhesive 106 may control the distance between the antenna units 104 and the proximate face of the circuit board 112. In some embodiments, the recesses 132 may have a depth between 200 microns and 400 microns. In some embodiments, the recesses 132 may be through-holes (i.e., the recesses 132 may extend all the way through the circuit board 112).

Figure 12:
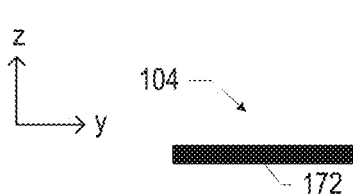
FIGS. 12 and 13 are side, cross-sectional views of example antenna patches, in accordance with various embodiments.
Figure 13:
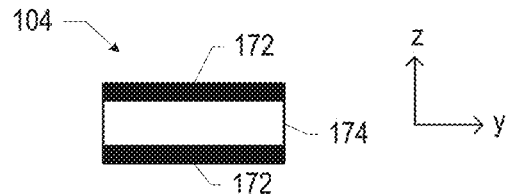

Any suitable antenna structures may provide the antenna units 104 of an antenna module 100. In some embodiments, an antenna unit 104 may include one, two, three, or more antenna layers. For example, FIGS. 12 and 13 are side, cross-sectional views of example antenna units 104, in accordance with various embodiments. In FIG. 12, the antenna unit 104 includes one antenna patch 172, while in FIG. 13, the antenna unit 104 includes two antenna patches 172 spaced apart by an intervening structure 174.

Figure 14:
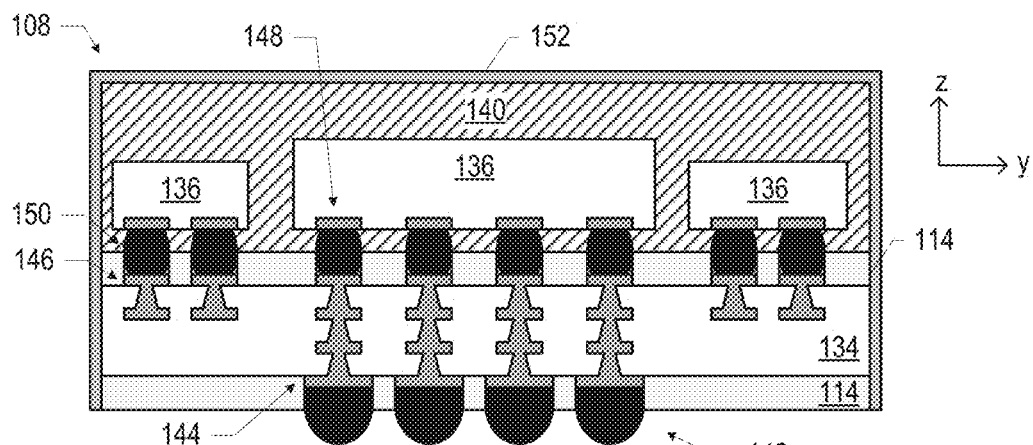
FIG. 14 is a side, cross-sectional view of an integrated circuit (IC) package that may be included in an antenna module, in accordance with various embodiments.

The IC package 108 included in an antenna module 100 may have any suitable structure. For example, FIG. 14 illustrates an example IC package 108 that may be included in an antenna module 100. The IC package 108 may include a package substrate 134 to which one or more components 136 may be coupled by first-level interconnects 150. In particular, conductive contacts 146 at one face of the package substrate 134 may be coupled to conductive contacts 148 at faces of the components 136 by first-level interconnects 150. The first-level interconnects 150 illustrated in FIG. 14 are solder bumps, but any suitable first-level interconnects 150 may be used. A solder resist 114 may be disposed around the conductive contacts 146. The package substrate 134 may include a dielectric material, and may have conductive pathways (e.g., including conductive vias and lines) extending through the dielectric material between the faces, or between different locations on each face. In some embodiments, the package substrate 134 may have a thickness less than 1 millimeter (e.g., between 0.1 millimeters and 0.5 millimeters). Conductive contacts 144 may be disposed at the other face of the package substrate 134, and second-level interconnects 142 may couple these conductive contacts 144 to the antenna board 102 (not shown) in an antenna module 100. The second-level interconnects 142 illustrated in FIG. 14 are solder balls (e.g., for a ball grid array arrangement), but any suitable second-level interconnects 142 may be used (e.g., pins in a pin grid array arrangement or lands in a land grid array arrangement). A solder resist 114 may be disposed around the conductive contacts 144. In some embodiments, a mold material 140 may be disposed around the components 136 (e.g., between the components 136 and the package substrate 134 as an underfill material). In some embodiments, a thickness of the mold material may be less than 1 millimeter. Example materials that may be used for the mold material 140 include epoxy mold materials, as suitable. In some embodiments, a conformal shield 152 may be disposed around the components 136 and the package substrate 134 to provide electromagnetic shielding for the IC package 108.

The components 136 may include any suitable IC components. In some embodiments, one or more of the components 136 may include a die. For example, one or more of the components 136 may be a RF communication die. In some embodiments, one or more of the components 136 may include a resistor, capacitor (e.g., decoupling capacitors), inductor, DC-DC converter circuitry, or other circuit elements. In some embodiments, the IC package 108 may be a system-in-package (SiP). In some embodiments, the IC package 108 may be a flip chip (FC) chip scale package (CSP). In some embodiments, one or more of the components 136 may include a memory device programmed with instructions to execute beam forming, scanning, and/or codebook functions.

Figure 15:
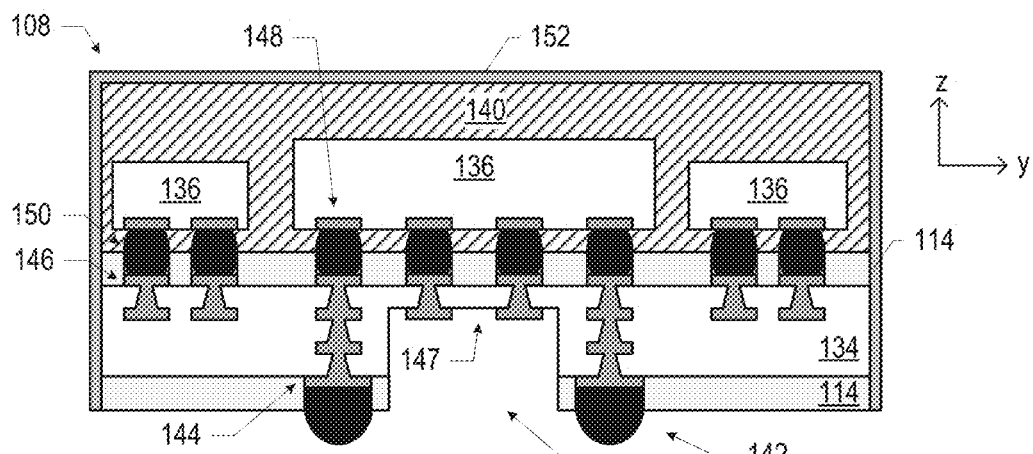
FIG. 15 is a side, cross-sectional view of another IC package that may be included in an antenna module, in accordance with various embodiments.

In some embodiments, a package substrate 134 of an IC package 108 in an antenna module 100 may include one or more recesses 143. For example, FIG. 15 illustrates an IC package 108 like the IC package 108 of FIG. 14, but in which the package substrate 134 includes a recess 143. A bottom surface 147 of the recess 143 may be provided by solid material of the package substrate 134. One or more antenna units 104 may be positioned "over" a recess 143 so that an air cavity 149 is present between the one or more antenna units 104 and solid material of the package substrate 134. A number of examples of such embodiments are discussed below with reference to FIGS. 15-20. In these figures, a single recess 143 is shown for ease of illustration, but any of the IC packages 108 disclosed herein may include multiple recesses 143 in their package substrates 134. For example, a single IC package 108 may include a package substrate 134 with multiple different recesses 143 over which corresponding different antenna boards 102 may be mounted. In another example, a single IC package 108 may include a package substrate 134 with multiple different recesses 143 and a single antenna board 102 having multiple different sets of one or more antenna units 104 may be mounted to the IC package 108 so that different sets of one or more antenna units 104 is mounted over different ones of the recesses 143. Any of the antenna modules 100 disclosed herein may include recesses 143 in the package substrate 134, and any of the antenna boards 102 disclosed herein, in any combination. A recess 143 may be formed in a package substrate 134 in any suitable manner (e.g., via three-dimensional printing, laser cutting or drilling the recess 143 into an existing package substrate, etc.).

Figure 16:
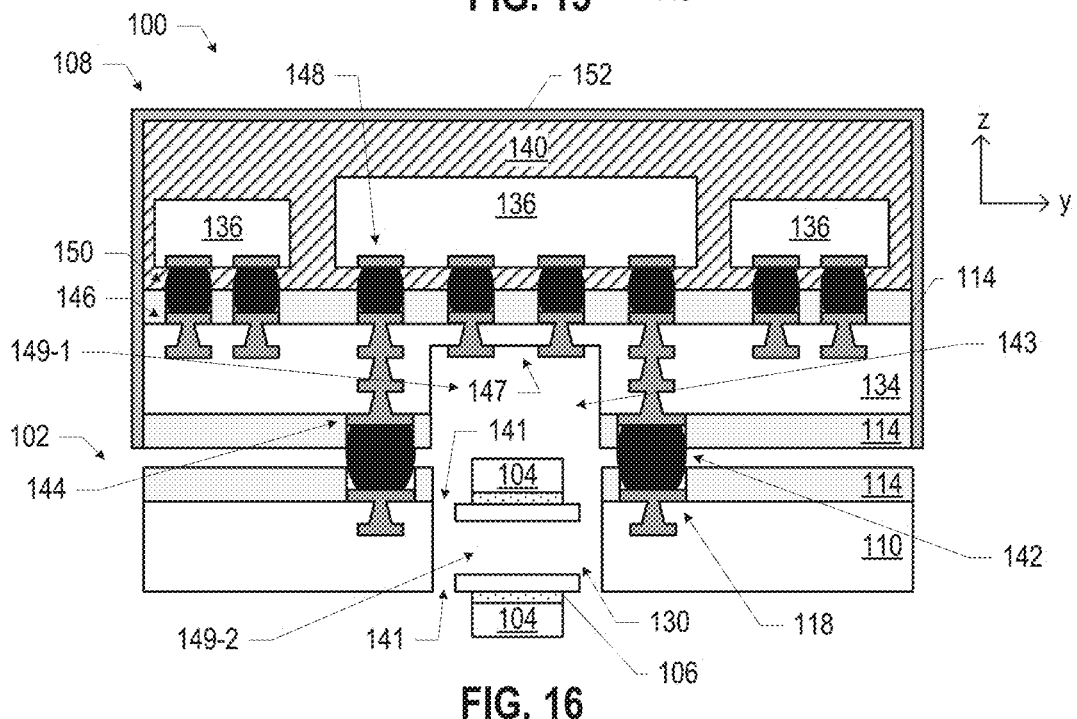
FIG. 16 is a side, cross-sectional view of an example antenna module including the IC package of FIG. 15, in accordance with various embodiments.

FIG. 16 illustrates an antenna module 100 in which the package substrate 134 of the IC package 108 includes a recess 143, and the antenna board 102 coupled to the IC package 108 includes two antenna units 104 (which may themselves each be a single antenna patch 179). An air cavity 149-1 may be present between the antenna units 104 and the bottom surface 147 of the recess 143. Further, the antenna units 104 of the antenna board 102 may have an air cavity 149-2 therebetween. In some embodiments, the top and bottom faces of the antenna board 102 may include openings 141 to act as vent holes between the air cavity 149-2 and the external environment.

Any suitable technique may be used to manufacture antenna board 102 like the antenna board 102 illustrated in FIG. 16; an example process flow is illustrated in FIG. 17. In particular, FIGS. 17A-17D illustrate various stages in the manufacture of the antenna board 102 of FIG. 16, in accordance with various embodiments. Although the operations of FIG. 17 may be illustrated with reference to particular embodiments of the antenna boards 102 disclosed herein, these operations may be used to manufacture any suitable antenna boards 102. Operations are illustrated once each and in a particular order in FIG. 17, but the operations may be reordered and/or repeated as desired (e.g., with different operations performed in parallel when manufacturing multiple antenna boards 102 simultaneously).

Figure 17A:
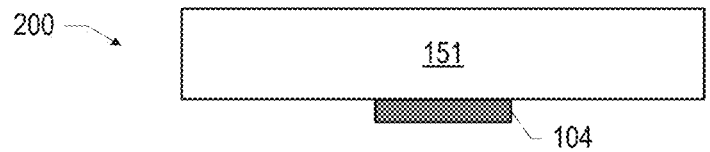
FIGS. 17A-17D illustrate various stages in an example process of manufacturing the antenna board of the antenna module of FIG. 16, in accordance with various embodiments.

FIG. 17A is a side, cross-sectional view of an assembly 200 including a first board portion 151. An antenna unit 104 may be mounted (e.g., via solder or an adhesive) to the first board portion 151; in other embodiments, the antenna unit 104 may be mounted at a later stage. The first board portion 151 may be a PCB, a plastic component, or may include any suitable material.

Figure 17B:
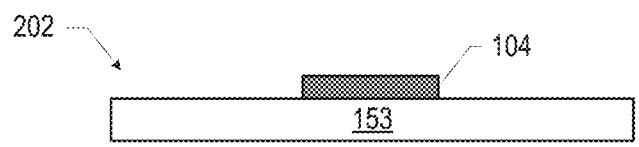

FIG. 17B is a side, cross-sectional view of an assembly 202 subsequent to forming a recess 145 in the first board portion 151 of the assembly 200 (FIG. 17A), and then bringing a second board portion 153 into proximity with the first board portion 151. An antenna unit 104 may be mounted (e.g., via solder or an adhesive) to the second board portion 153; in other embodiments, the antenna unit 104 may be mounted to the second board portion 153 at a later stage. In some embodiments, the recess 145 may be formed by mechanical drilling (e.g., landing on a metal plane when the first board portion 151 is a PCB). In some embodiments, the first board portion 151 may be manufactured (e.g., by three-dimensional printing) in the form illustrated in FIG. 17B, and thus no recess 145 need be separately formed.

Figure 17C:
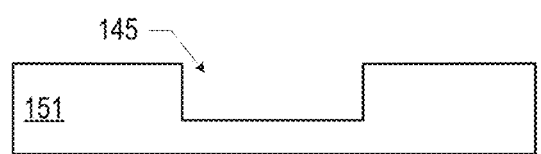

FIG. 17C is a side, cross-sectional view of an assembly 204 subsequent to coupling the second board portion 153 and the first board portion 151 of the assembly 202 (FIG. 17B) together to form an initial patch support 157. The coupling of the second board portion 153 and the first board portion 151 may be performed using any suitable technique (e.g., gluing, soldering, laminating, etc.).

Figure 17D:
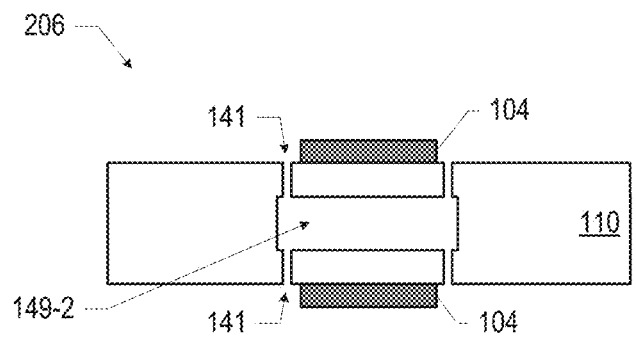

FIG. 17D is a side, cross-sectional view of an assembly 206 subsequent to forming openings 141 in the top and bottom faces of the initial patch support 157 of the assembly 204 (FIG. 17C) to form the antenna patch support 110. The openings 141 may provide an air hole for venting the interior of the antenna board 102.

Figure 18:
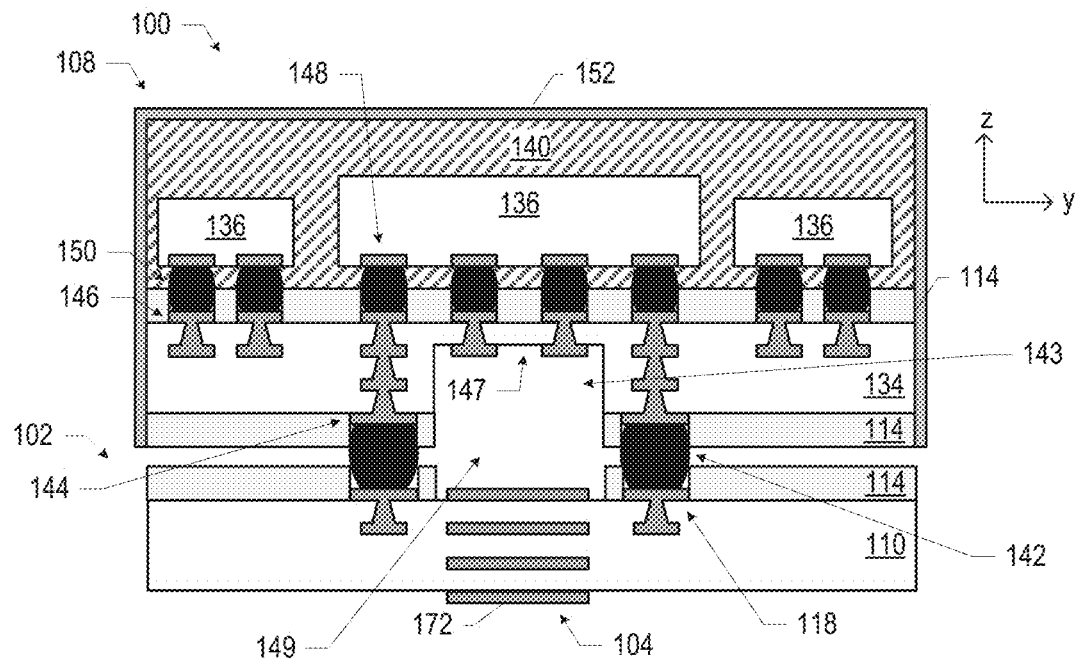
FIGS. 18-20 are side, cross-sectional views of other example antenna modules including the IC package of FIG. 15, in accordance with various embodiments.

FIG. 18 illustrates another example of an antenna module 100 in which the package substrate 134 of the IC package 108 includes a recess 143. In the embodiment of FIG. 18, the antenna board 102 coupled to the IC package 108 includes multiple antenna patches 179, providing an antenna unit 104. An air cavity 149 may be present between the antenna unit 104 and the bottom surface 147 of the recess 143. The antenna patches 179 of FIG. 18 may be embedded in solid material of the antenna patch support 110. For example, in embodiments in which the antenna patch support 110 includes a PCB, the antenna patches 179 may be portions of metallization layers in the antenna patch support 110 (with solid dielectric material therebetween). Although four antenna patches 179 are illustrated in FIG. 18, an antenna board 102 may include any suitable number of antenna patches 179, as discussed herein.

Figure 19:
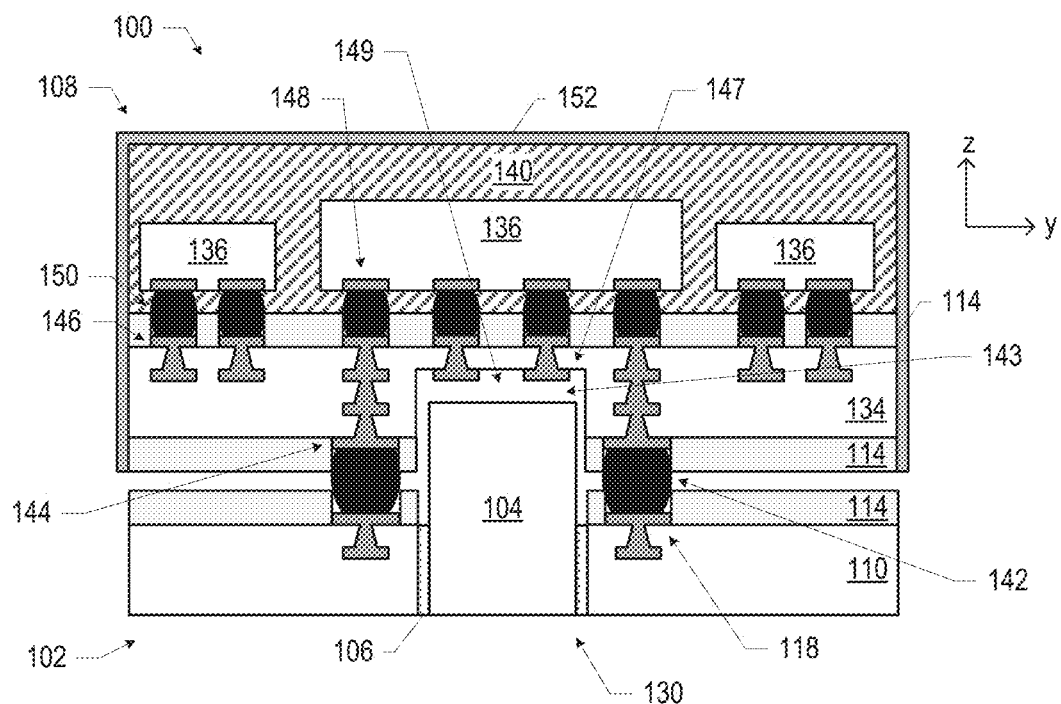
Figure 20:
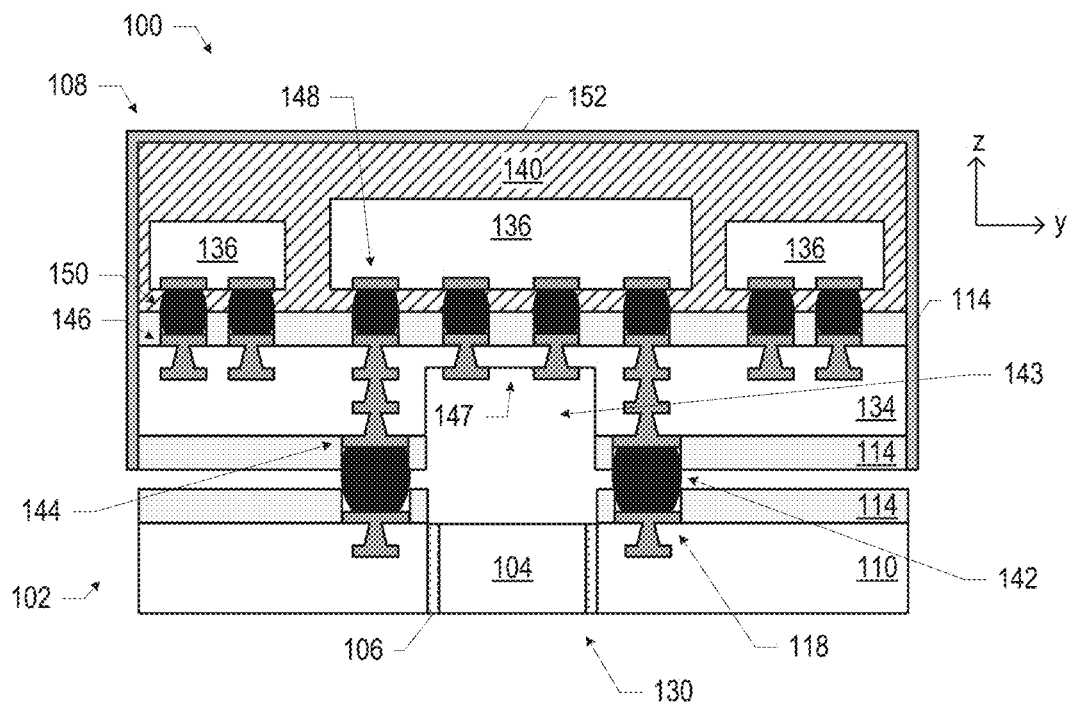

In some embodiments, an antenna unit 104 of an antenna board 102 may extend into the recess 143 of a package substrate 134, while in other embodiments, the antenna unit 104 may not extend into the recess 143. For example, FIG. 19 illustrates an example of an antenna module 100 in which the package substrate 134 of the IC package 108 includes a recess 143. In the embodiment of FIG. 18, the antenna board 102 coupled to the IC package 108 includes an antenna unit 104 that is secured in an opening in the antenna patch support 110 by an adhesive 106 (e.g., an epoxy). The antenna unit 104 of FIG. 19 may extend into the recess 143 of the package substrate 134, and an air cavity 149 may be present between the antenna unit 104 and the bottom surface 147 of the recess 143. FIG. 20 illustrates an antenna module 100 similar to that of FIG. 19, but in which the antenna unit 104 does not extend into the recess 143.

Figure 21:
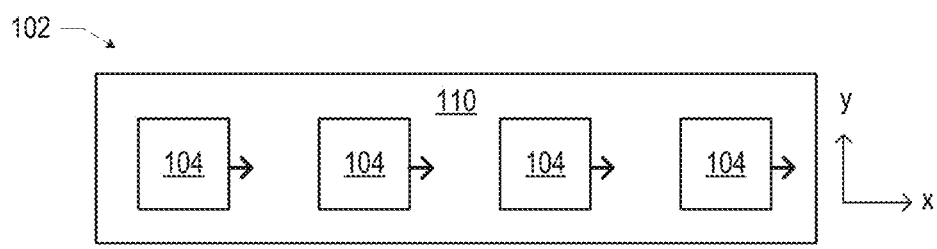
FIGS. 21 and 22 are bottom views of example antenna patch arrangements in an antenna board, in accordance with various embodiments.
Figure 22:
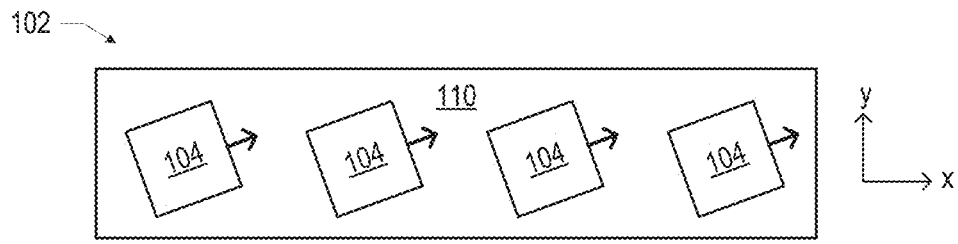
Figure 23:
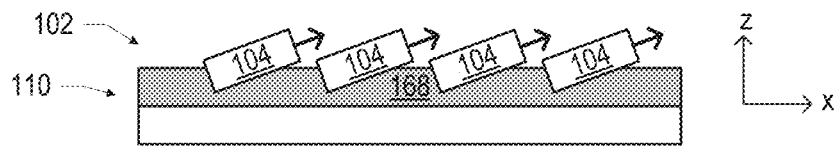
FIG. 23 is a side, cross-sectional view of an example antenna patch arrangement in an antenna board, in accordance with various embodiments.

In an antenna module 100 that includes multiple antenna units 104, these multiple antenna units 104 may be arranged in any suitable manner. For example, FIGS. 21 and 22 are bottom views of example arrangements of antenna units 104 in an antenna board 102, in accordance with various embodiments. In the embodiment of FIG. 21, the antenna units 104 are arranged in a linear array in the x-direction, and the x-axes of each of the antenna units 104 (indicated in FIG. 21 by small arrows proximate to each antenna unit 104) are aligned with the axis of the linear array. In other embodiments, the antenna units 104 may be arranged so that one or more of their axes are not aligned with the direction of the array. For example, FIG. 22 illustrates an embodiment in which the antenna units 104 are distributed in a linear array in the x-direction, but the antenna units 104 have been rotated in the x-y plane (relative to the embodiment of FIG. 21) so that the x-axis of each of the antenna units 104 is not aligned with the axis of the linear array. In another example, FIG. 23 illustrates an embodiment in which the antenna units 104 are distributed in a linear array in the x-direction, but the antenna patches have been rotated in the x-z plane (relative to the embodiment of FIG. 21) so that the x-axis of each of the antenna units 104 is not aligned with the axis of the linear array. In the embodiment of FIG. 23, the antenna patch support 110 may include an antenna patch fixture 164 that may maintain the antenna units 104 at the desired angle. In some embodiments, the "rotations" of FIGS. 22 and 23 may be combined so that an antenna unit 104 is rotated in both the x-y and the x-z plane when the antenna unit 104 is part of a linear array distributed in the x-direction. In some embodiments, some but not all of the antenna units 104 in a linear array may be "rotated" relative to the axis of the array. Rotating an antenna unit 104 relative to the direction of the array may reduce patch-to-patch coupling (by reducing the constructive addition of resonant currents between antenna units 104), improving the impedance bandwidth and the beam steering range. The arrangements of FIGS. 21-23 (and combinations of such arrangements) is referred to herein as the antenna units 104 being "rotationally offset" from the linear array.

Although FIGS. 21-23 illustrate multiple antenna units 104 mounted on a common antenna patch support 110 in a single antenna board 102, the rotationally offset arrangements of FIGS. 21-23 may also be utilized when multiple antenna units 104 are divided among different antenna boards 102. For example, in an embodiment in which multiple different antenna boards 102 are mounted to a common IC package 108 (e.g., as discussed below with reference to FIG. 41), the antenna units 104 in each of the different antenna boards 102 may together provide a linear array, and may be rotationally offset from that linear array.

Figure 24:
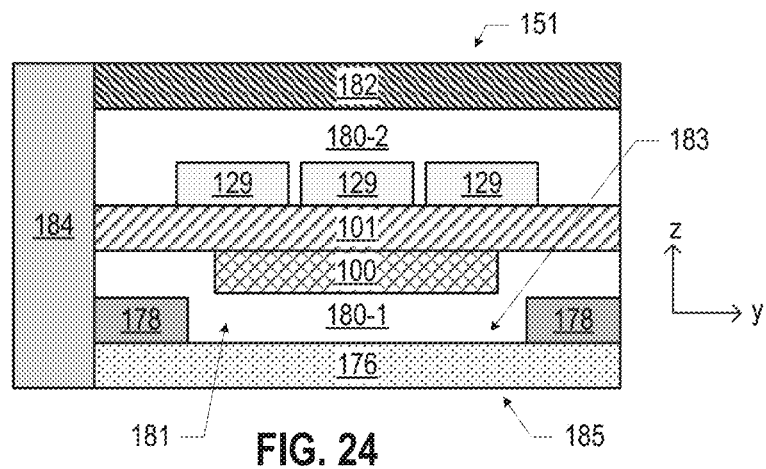
FIG. 24 is a side, cross-sectional view of a portion of a communication device including an antenna module, in accordance with various embodiments.

The antenna modules 100 disclosed herein may be included in any suitable communication device (e.g., a computing device with wireless communication capability, a wearable device with wireless communication circuitry, etc.). FIG. 24 is a side, cross-sectional view of a portion of a communication device 151 including an antenna module 100, in accordance with various embodiments. In particular, the communication device 151 illustrated in FIG. 24 may be a handheld communication device, such as a smart phone or tablet. The communication device 151 may include a glass or plastic back cover 176 proximate to a metallic or plastic chassis 178. In some embodiments, the chassis 178 may be laminated onto an inner face of the back cover 176, or attached to the back cover 176 with an adhesive. In some embodiments, the portion of the chassis 178 adjacent to the back cover 176 may have a thickness between 0.1 millimeters and 0.4 millimeters; in some such embodiments, this portion of the chassis 178 may be formed of metal. In some embodiments, the back cover 176 may have a thickness between 0.3 millimeters and 1.5 millimeters; in some such embodiments, the back cover 176 may be formed of glass. The chassis 178 may include one or more windows 181 that align with antenna units 104 (not shown) of the antenna module 100 to improve performance. An air cavity 180-1 may space at least some of the antenna module 100 from the air cavityback cover 176. In some embodiments, the height of the air cavity 180-1 may be between 0.5 millimeters and 3 millimeters. In some embodiments, the antenna module 100 may be mounted to a face of a circuit board 101 (e.g., a motherboard), and other components 129 (e.g., other IC packages) may be mounted to the opposite face of the circuit board 101. In some embodiments, the circuit board 101 may have a thickness between 0.2 millimeters and 1 millimeter (e.g., between 0.3 millimeters and 0.5 millimeters). Another air cavity 180-2 may be located between the circuit board 101 and a display 182 (e.g., a touch screen display). In other embodiments, an antenna module 100 may not be mounted to a circuit board 101; instead, the antenna module 100 may be secured directly to the chassis 178 (e.g., as discussed below). In some embodiments, the spacing between the antenna units 104 (not shown) of the antenna module 100 and the back cover 176 may be selected and controlled within tens of microns to achieve desired performance. The air cavity 180-2 may separate the antenna module 100 from the display 182 on the front side of the communication device 151; in some embodiments, the display 182 may have a metal layer proximate to the air cavity 180-2 to draw heat away from the display 182. A metal or plastic housing 184 may provide the "sides" of the communication device 151.

The antenna modules 100 disclosed herein may be secured in a communication device in any desired manner. For example, as noted above, in some embodiments, the antenna module 100 may be secured to the chassis 178. A number of the embodiments discussed below refer to fixtures that secure an antenna module 100 (or an antenna board 102, for ease of illustration) to the chassis 178 of a communication device, but any of the fixtures discussed below may be used to secure an antenna module 100 to any suitable portion of a communication device.

Figure 25:
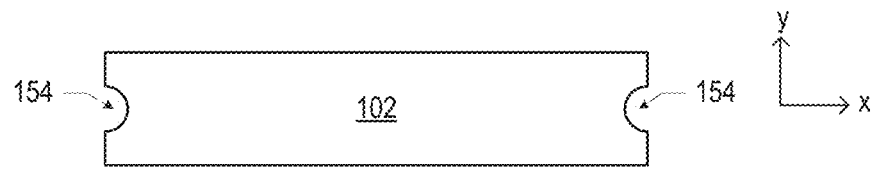
FIG. 25 is a top view of an example antenna board, in accordance with various embodiments.
Figure 26:
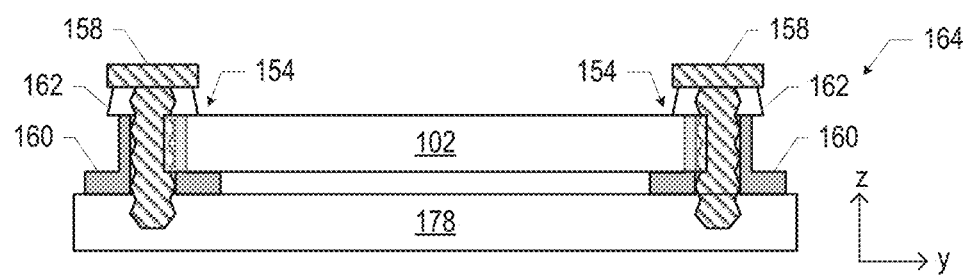
FIG. 26 is a side, cross-sectional view of the antenna board of FIG. 25 coupled to an antenna board fixture, in accordance with various embodiments.

In some embodiments, an antenna board 102 may include cutouts that may be used to secure the antenna board 102 to a chassis 178. For example, FIG. 25 is a top view of an example antenna board 102 including two cutouts 154 at either longitudinal end of the antenna board 102. The antenna board 102 of FIG. 25 may be part of an antenna module 100, but only the antenna board 102 is depicted in FIG. 25 for ease of illustration. FIG. 26 is a side, cross-sectional view of the antenna board 102 of FIG. 25 coupled to an antenna board fixture 164, in accordance with various embodiments. In particular, the antenna board fixture 164 of FIG. 26 may include two assemblies at either longitudinal end of the antenna board 102. Each assembly may include a boss 160 (on or part of the chassis 178), a spacer 162 on the top surface of the boss 160, and a screw 158 that extends through a hole in the spacer 162 and screws into threads in the boss 160. The antenna board 102 may be clamped between the spacer 162 and the top of the boss 160 by the tightened screw 158; the boss 160 may be at least partially set in the proximate cutout 154. In some embodiments, the outer dimensions of the antenna board 102 of FIG. 25 may be approximately 5 millimeters by approximately 38 millimeters.

In some embodiments, the screws 158 disclosed herein may be used to dissipate heat generated by the antenna module 100 during operation. In particular, in some embodiments, the screws 158 may be formed of metal, and the boss 160 and the chassis 178 may also be metallic (or may otherwise have a high thermal conductivity); during operation, heat generated by the antenna module 100 may travel away from the antenna module 100 through the screws 158 and into the chassis 178, mitigating or preventing an over-temperature condition. In some embodiments, a thermal interface material (TIM), such as a thermal grease, may be present between the antenna board 102 and the screws 158/boss 160 to improve thermal conductivity.

In some embodiments, the screws 158 disclosed herein may be used as additional antennas for the antenna module 100. In some such embodiments, the boss 160 (and other materials with which the screws 158 come into contact) may be formed of plastic, ceramic, or another non-conducting material. The shape and location of the screws 158 may be selected so that the screws 158 act as antenna units 104 for the antenna board 102.

Figure 27:
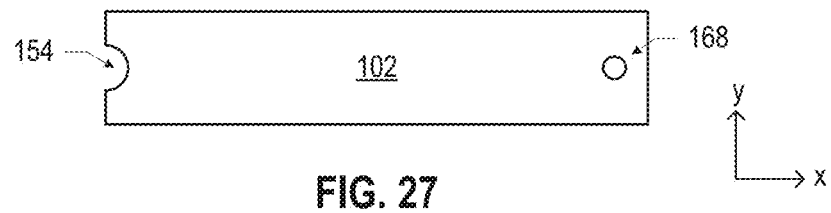
FIG. 27 is a top view of an example antenna board, in accordance with various embodiments.
Figure 28:
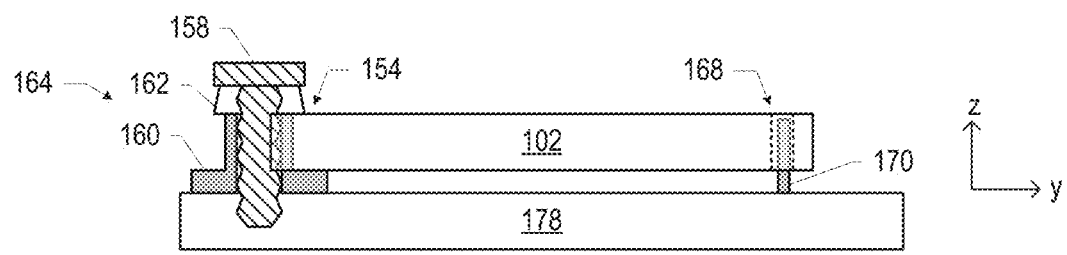
FIG. 28 is a side, cross-sectional view of the antenna board of FIG. 27 coupled to an antenna board fixture, in accordance with various embodiments.

An antenna board 102 may include other arrangements of cutouts. For example, FIG. 27 is a top view of an example antenna board 102 including a cutout 154 at one longitudinal end and a hole 168 proximate to the other longitudinal end. The antenna board 102 of FIG. 27 may be part of an antenna module 100, but only the antenna board 102 is depicted in FIG. 27 for ease of illustration. FIG. 28 is a side, cross-sectional view of the antenna board 102 of FIG. 27 coupled to an antenna board fixture 164, in accordance with various embodiments. In particular, the antenna board fixture 164 of FIG. 28 may include two assemblies at either longitudinal end of the antenna board 102. The assembly proximate to the cutout 154 may include the boss 160/spacer 162/screw 158 arrangement discussed above with reference to FIG. 26. The assembly proximate to the hole 168 may include a pin 170 extending from the chassis 178. The antenna board 102 may be clamped between the spacer 162 and the top of the boss 160 by the tightened screw 158 at one longitudinal end (the boss 160 may be at least partially set in the proximate cutout 154), and the other longitudinal end may be prevented from moving in the x-y plane by the pin 170 in the hole 168.

Figure 29A:
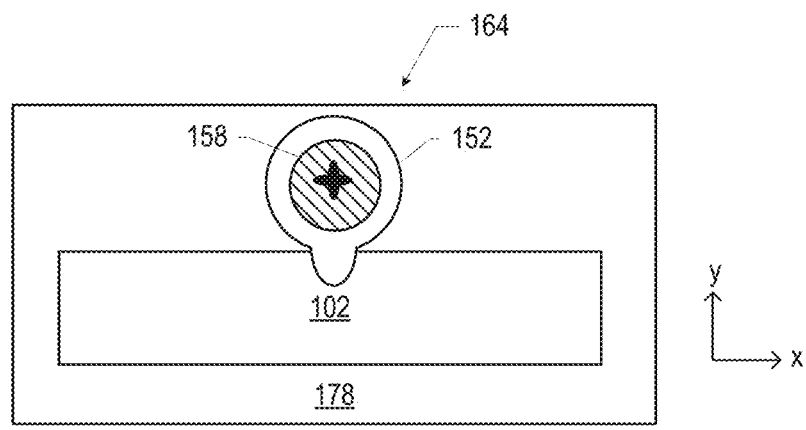
FIGS. 29A and 29B are a top view and a side, cross-sectional view, respectively, of an antenna board coupled to an antenna board fixture, in accordance with various embodiments.
Figures 29B, 30:
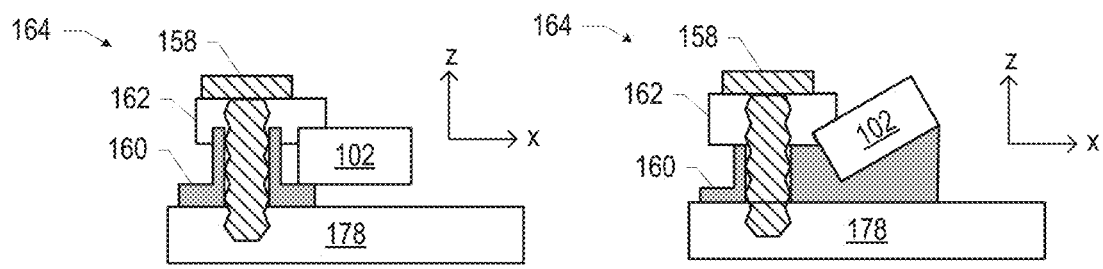
FIG. 30 is a side, cross-sectional view of an antenna board coupled to an antenna board fixture, in accordance with various embodiments.

In some embodiments, an antenna module 100 may be secured to a communication device at one or more locations along the length of the antenna board 102, in addition to or instead of at the longitudinal ends of the antenna board 102. For example, FIGS. 29A and 29B are a top view and a side, cross-sectional view, respectively, of an antenna board 102 coupled to an antenna board fixture 164, in accordance with various embodiments. The antenna board 102 of FIG. 29 may be part of an antenna module 100, but only the antenna board 102 is depicted in FIG. 29 for ease of illustration. In the antenna board fixture 164 of FIG. 29, a boss 160 (one or part of the chassis 178), a spacer 162 on the top surface of the boss 160, and a screw 158 that extends through a hole in the spacer 162 and screws into threads in the boss 160. The exterior of the boss 160 of FIG. 29 may have a square cross-section, and the spacer 162 may have a square recess on its lower surface so as to partially wrap around the boss 160 while being prevented from rotating around the boss 160. The antenna board 102 may be clamped between the spacer 162 and the top of the boss 160 by the tightened screw 158. In some embodiments, the antenna board 102 may not have a cutout 154 along its longitudinal length (as shown); while in other embodiments, the antenna board 102 may have one or more cutouts 154 along its long edges.

In some embodiments, an antenna module 100 may be secured to a surface in a communication device so that the antenna module 100 (e.g., an array of antenna units 104 in the antenna module) is not parallel to the surface. Generally, the antenna units 104 may be positioned at any desired angle relative to the chassis 178 or other elements of a communication device. FIG. 30 illustrates an antenna board fixture 164 in which the antenna board 102 may be held at an angle relative to the underlying surface of the chassis 178. The antenna board 102 of FIG. 30 may be part of an antenna module 100, but only the antenna board 102 is depicted in FIG. 30 for ease of illustration. The antenna board fixture 164 may be similar to the antenna board fixtures of FIGS. 26, 28, and 29, but may include a boss 160 having an angled portion on which the antenna board 102 may rest. When the screw 158 is tightened, the antenna board 102 may be held at a desired angle relative to the chassis 178.

The antenna boards 102, IC packages 108, and other elements disclosed herein may be arranged in any suitable manner in an antenna module 100. For example, an antenna module 100 may include one or more connectors 105 for transmitting signals into and out of the antenna module 100. FIGS. 31-34 are exploded, perspective views of example antenna modules 100, in accordance with various embodiments.

Figure 31:
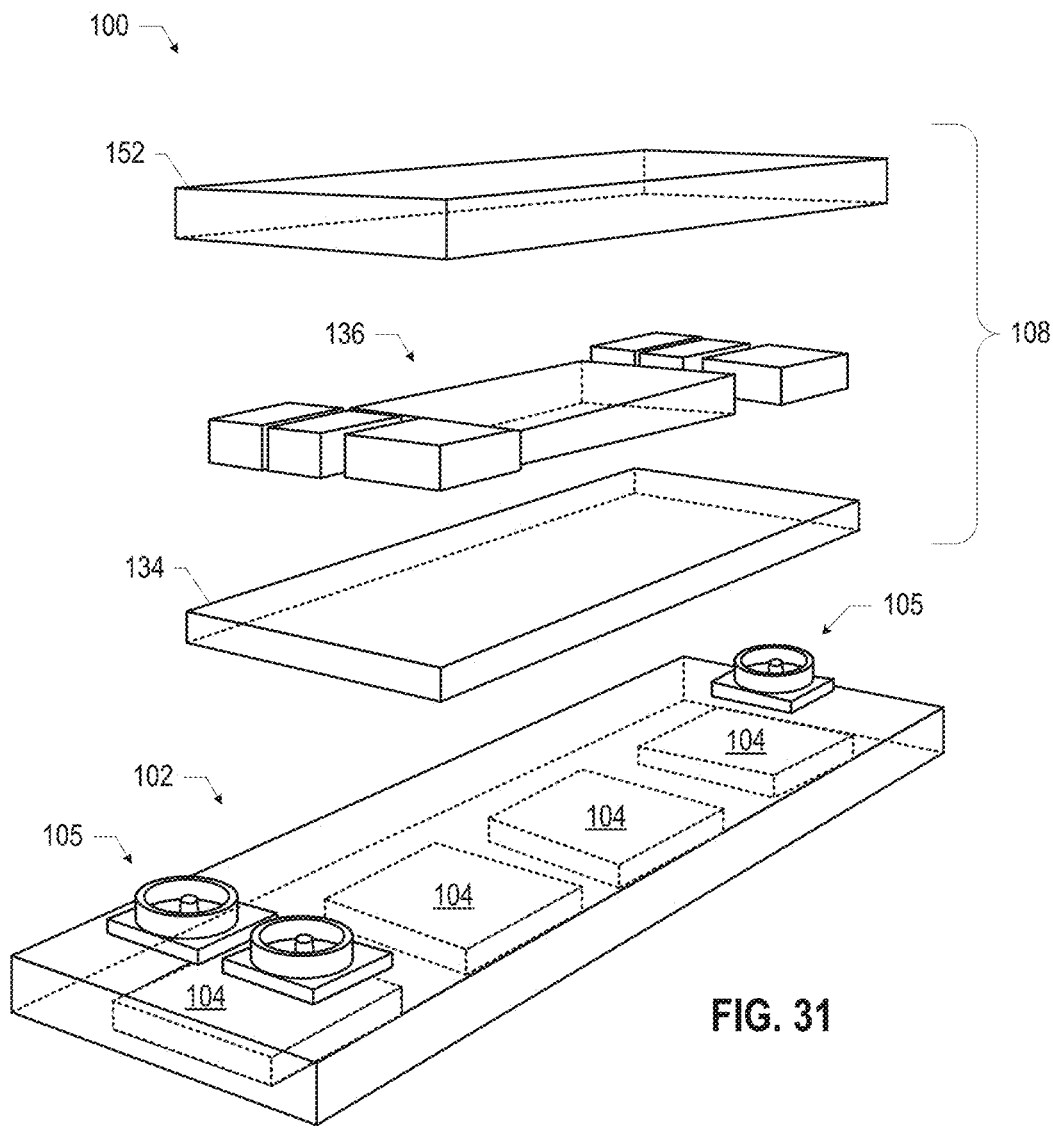
FIGS. 31-34 are exploded, perspective views of example antenna modules, in accordance with various embodiments.

In the embodiment of FIG. 31, an antenna board 102 includes four antenna units 104. These antenna units 104 may be arranged in the antenna board 102 in accordance with any of the embodiments disclosed herein (e.g., with recesses 130/132, rotated relative to the axis of the array, on a bridge structure 124, etc.). One or more connectors 105 may be disposed on the antenna board 102; these connectors 105 may be coaxial cable connectors, as shown, or any other connectors (e.g., the flat cable connectors discussed below with reference to FIGS. 35 and 36). The connectors 105 may be suitable for transmitting radio frequency (RF) signals, for example. The IC package 108 may include a package substrate 134, one or more components 136 coupled to the package substrate 134, and a conformal shield 152 over the components 136 and the package substrate 134. In some embodiments, the four antenna units 104 may provide a 1×4 array for 28/39 gigahertz communication, and a 1×8 array of 60 gigahertz dipoles.

Figure 32:
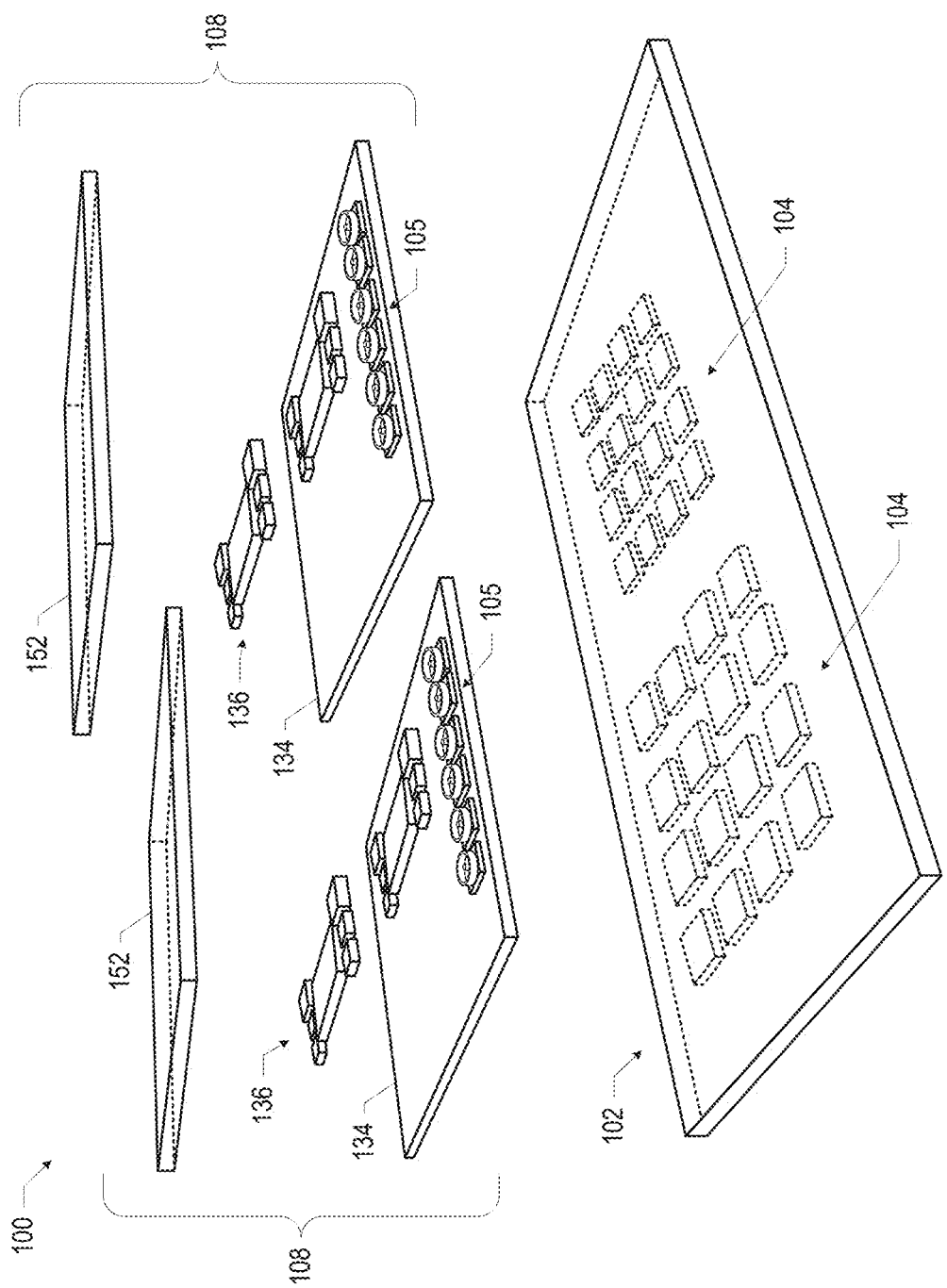

In the embodiment of FIG. 32, an antenna board 102 includes two sets of sixteen antenna units 104, each set arranged in a 4×4 array. These antenna units 104 may be arranged in the antenna board 102 in accordance with any of the embodiments disclosed herein (e.g., with recesses 130/132, rotated relative to the axis of the array, on a bridge structure 124, etc.). The antenna module 100 of FIG. 32 includes two IC packages 108; one IC package 108 associated with (and disposed over) one set of antenna units 104, and the other IC package 108 associated with (and disposed over) the other set of antenna units 104. In some embodiments, one set of antenna units 104 may support 28 gigahertz communications, and the other set of antenna units 104 may support 39 gigahertz communications. The IC package 108 may include a package substrate 134, one or more components 136 coupled to the package substrate 134, and a conformal shield 152 over the components 136 and the package substrate 134. One or more connectors 105 may be disposed on the package substrate 134; these connectors 105 may be coaxial cable connectors, as shown, or any other connectors (e.g., the flat cable connectors discussed below with reference to FIGS. 35 and 36). The conformal shields 152 may not extend over the connectors 105. In some embodiments, the antenna module 100 of FIG. 32 may be suitable for use in routers and customer premises equipment (CPE). In some embodiments, the outer dimensions of the antenna board 102 may be approximately 22 millimeters by approximately 40 millimeters.

Figure 33:
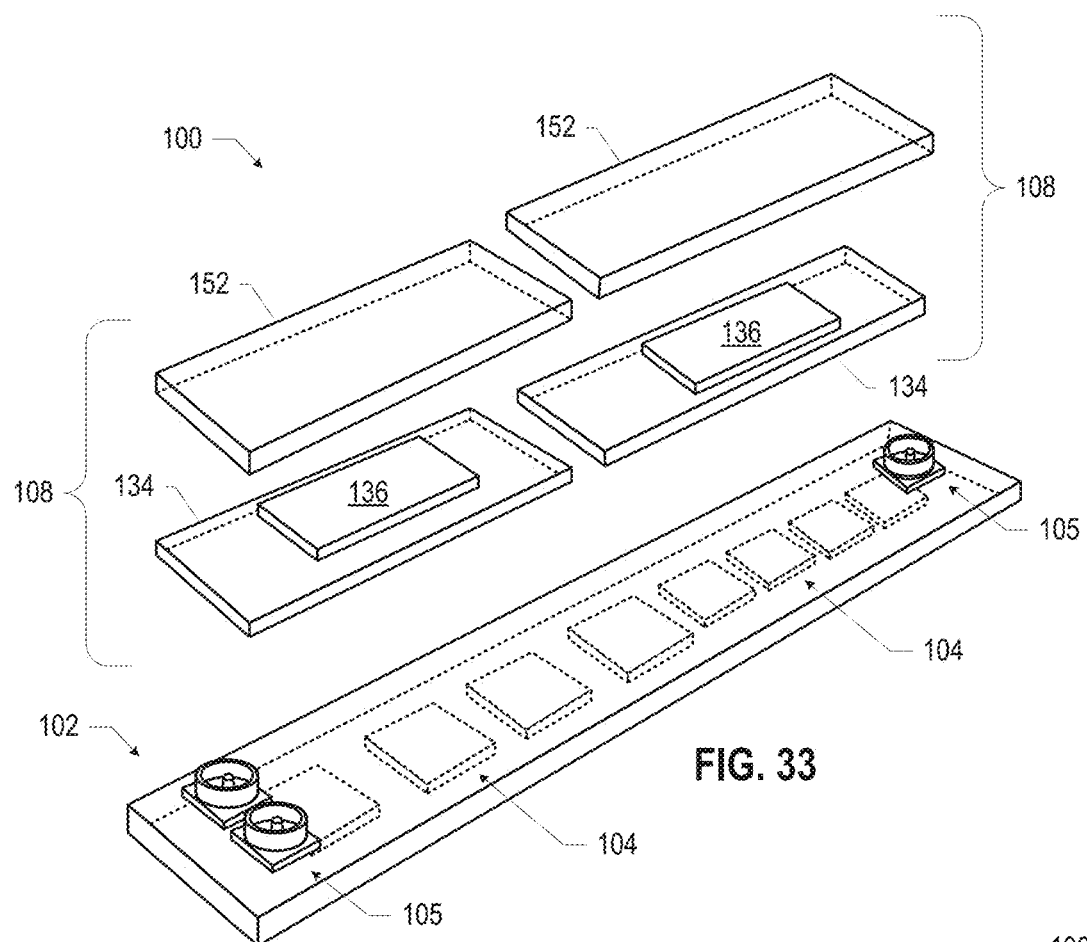

In the embodiment of FIG. 33, an antenna board 102 includes two sets of four antenna units 104, each set arranged in a 1×4 array. In some embodiments, one set of antenna units 104 may support 28 gigahertz communications, and the other set of antenna units 104 may support 39 gigahertz communications. These antenna units 104 may be arranged in the antenna board 102 in accordance with any of the embodiments disclosed herein (e.g., with recesses 130/132, rotated relative to the axis of the array, on a bridge structure 124, etc.). One or more connectors 105 may be disposed on the antenna board 102; these connectors 105 may be coaxial cable connectors, as shown, or any other connectors (e.g., the flat cable connectors discussed below with reference to FIGS. 35 and 36). The antenna module 100 of FIG. 33 includes two IC packages 108; one IC package 108 associated with (and disposed over) one set of antenna units 104, and the other IC package 108 associated with (and disposed over) the other set of antenna units 104. The IC package 108 may include a package substrate 134, one or more components 136 coupled to the package substrate 134, and a conformal shield 152 over the components 136 and the package substrate 134. In some embodiments, the outer dimensions of the antenna board 102 may be approximately 5 millimeters by approximately 32 millimeters.

Figure 34:
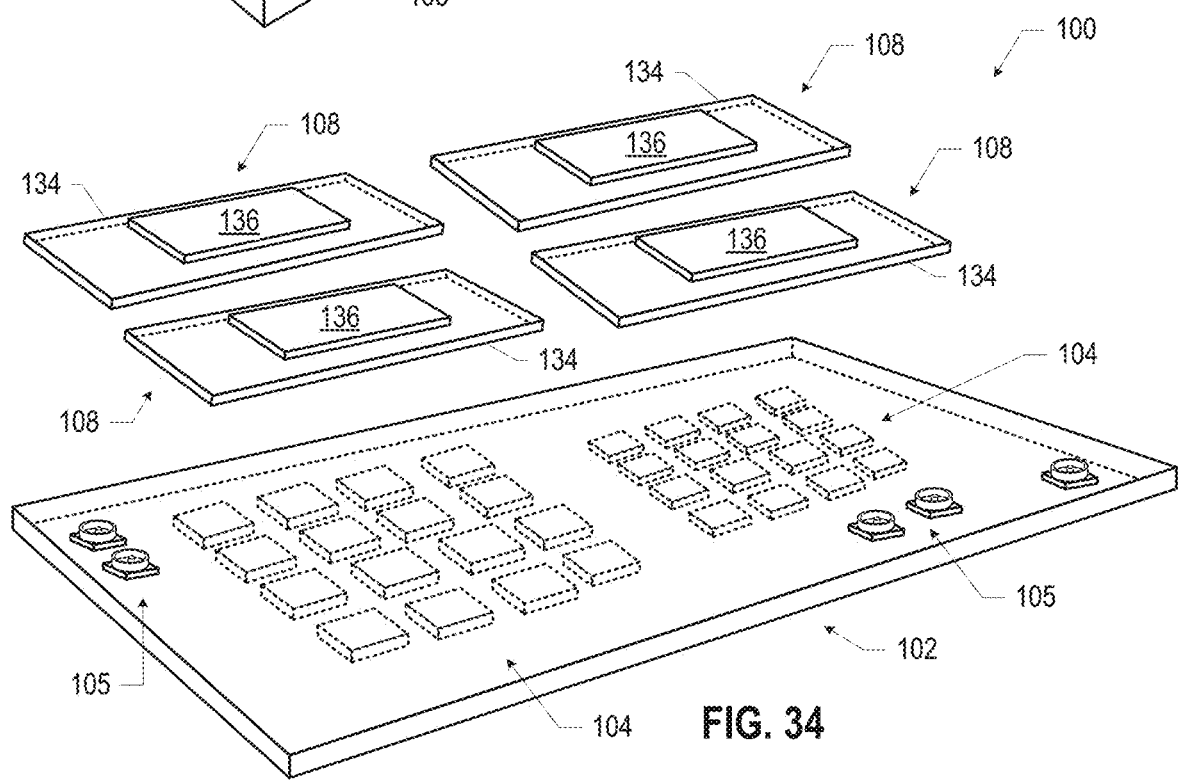

In the embodiment of FIG. 34, an antenna board 102 includes two sets of sixteen antenna units 104, each set arranged in a 4×4 array. These antenna units 104 may be arranged in the antenna board 102 in accordance with any of the embodiments disclosed herein (e.g., with recesses 130/132, rotated relative to the axis of the array, on a bridge structure 124, etc.). The antenna module 100 of FIG. 34 includes four IC packages 108; two IC packages 108 associated with (and disposed over) one set of antenna units 104, and the other two IC packages 108 associated with (and disposed over) the other set of antenna units 104. The IC package 108 may include a package substrate 134, one or more components 136 coupled to the package substrate 134, and a conformal shield (not shown) over the components 136 and the package substrate 134. One or more connectors 105 may be disposed on the antenna board 102; these connectors 105 may be coaxial cable connectors, as shown, or any other connectors (e.g., the flat cable connectors discussed below with reference to FIGS. 35 and 36).

Figure 35:
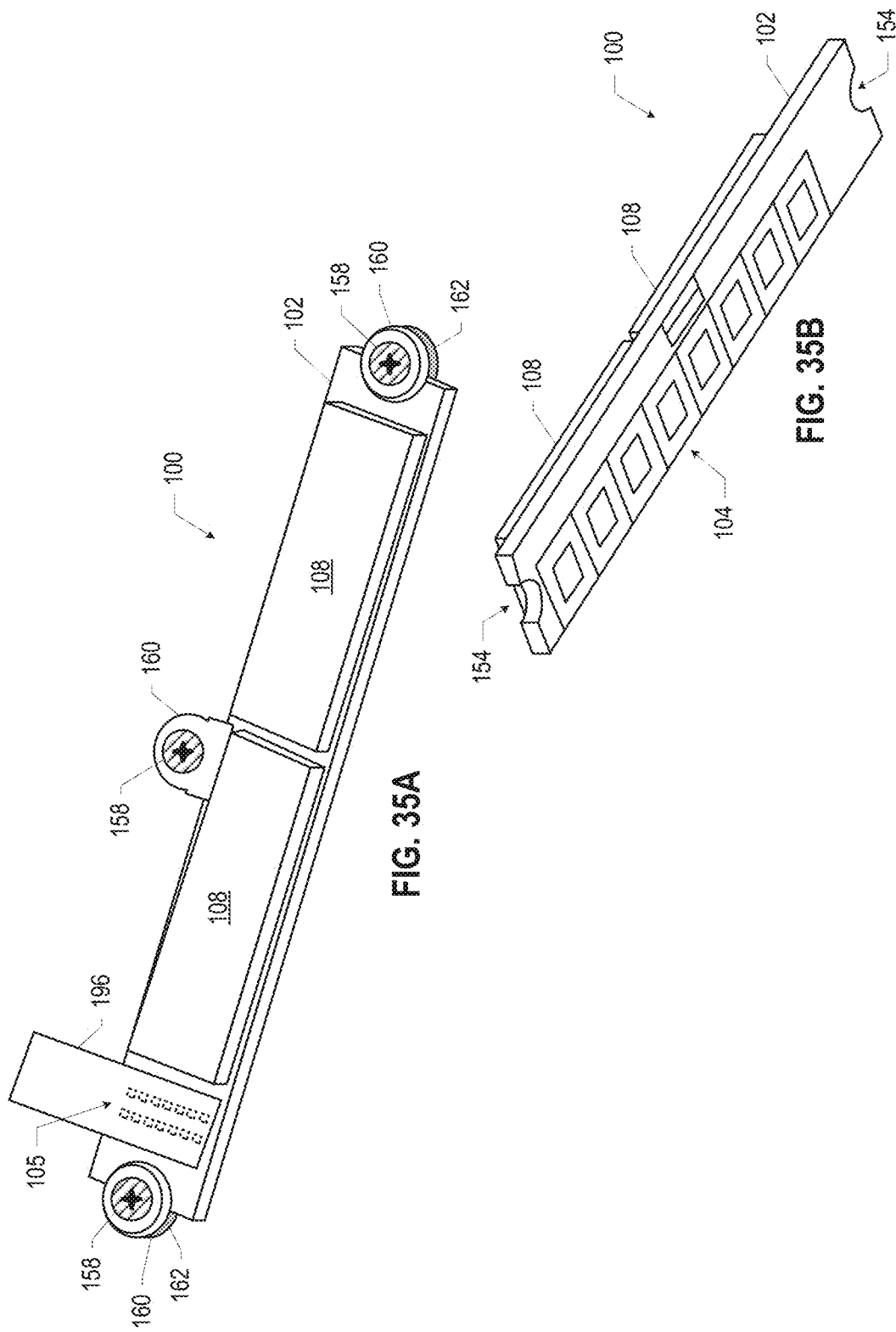
FIGS. 35A and 35B are top and bottom perspective views, respectively, of an example antenna module, in accordance with various embodiments.

FIGS. 35A and 35B are top and bottom perspective views, respectively, of another example antenna module 100, in accordance with various embodiments. In the embodiment of FIG. 35, an antenna board 102 includes two sets of four antenna units 104, each set arranged in a 1×4 array. These antenna units 104 may be arranged in the antenna board 102 in accordance with any of the embodiments disclosed herein (e.g., with recesses 130/132, rotated relative to the axis of the array, on a bridge structure 124, etc.). One or more connectors 105 may be disposed on the antenna board 102; these connectors 105 may be flat cable connectors (e.g., flexible printed circuit (FPC) cable connectors) to which a flat cable 196 may be coupled. The antenna module 100 of FIG. 33 includes two IC packages 108; one IC package 108 associated with (and disposed over) one set of antenna units 104, and the other IC package 108 associated with (and disposed over) the other set of antenna units 104. The antenna module 100 of FIG. 33 may also include cutouts 154 at either longitudinal end; FIG. 35A illustrates the antenna module 100 secured by the antenna board fixtures 164 of FIG. 26 (at either longitudinal end) and by the antenna board fixture 164 of FIG. 29 (in the middle). In some embodiments, the antenna units 104 of the antenna module 100 of FIG. 35 may use the proximate edges of the antenna board 102 for vertical and horizontal polarized edge fire antennas; in such an embodiment, the conformal shield 152 of the IC packages 108 may act as a reference. More generally, the antenna units 104 disclosed herein may be used for broadside or edge fire applications, as appropriate.

Figure 36:
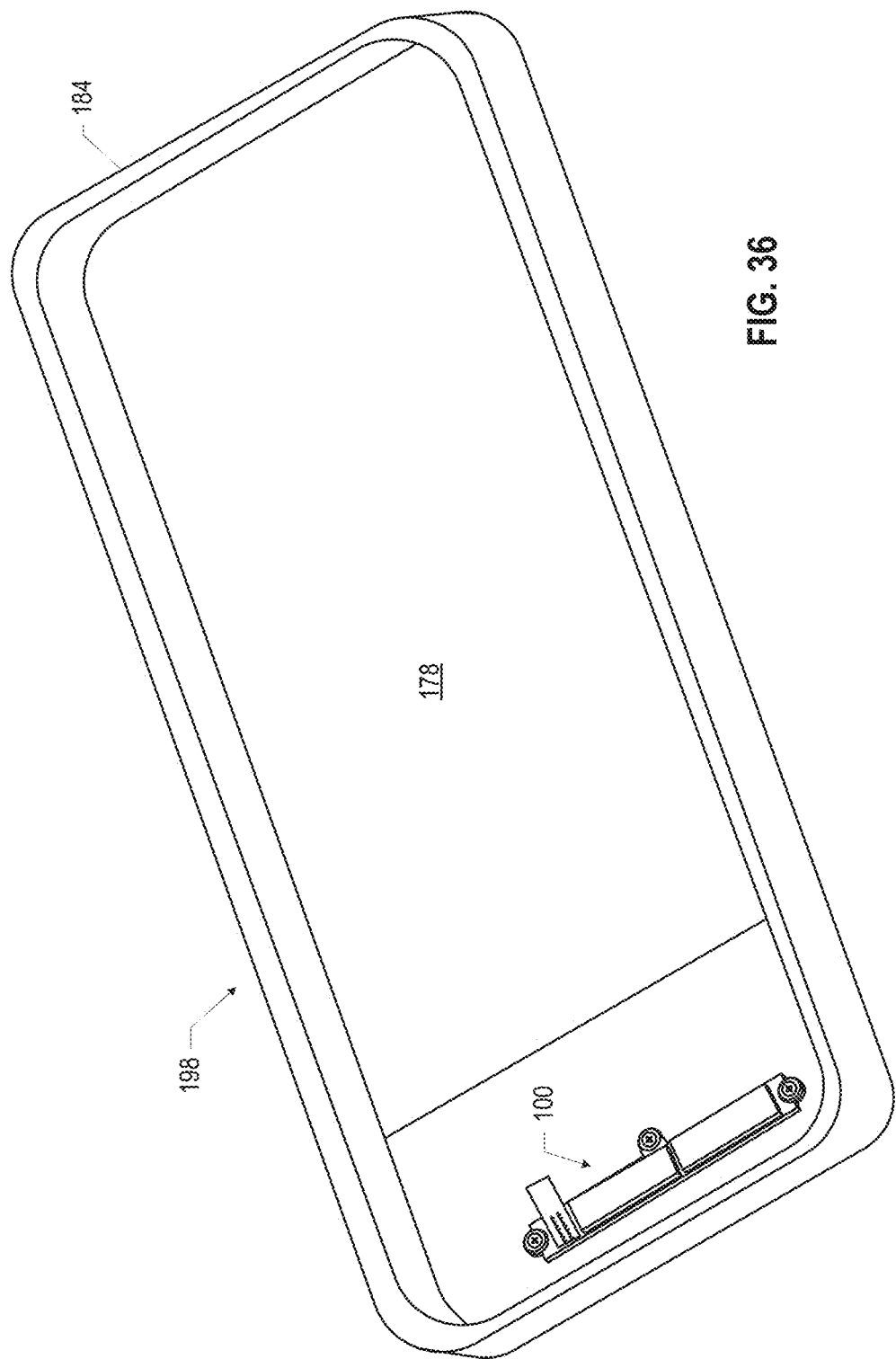
FIG. 36 is a perspective view of a handheld communication device including an antenna module, in accordance with various embodiments.

Any suitable communication device may include one or more of the antenna modules 100 disclosed herein. For example, FIG. 36 is a perspective view of a handheld communication device 198 including an antenna module 100, in accordance with various embodiments. In particular, FIG. 36 depicts the antenna module 100 (and associated antenna board fixtures 164) of FIG. 35 coupled to a chassis 178 of the handheld communication device 198 (which may be the communication device 151 of FIG. 24). In some embodiments, the handheld communication device 198 may be a smart phone.

FIG. 37 is a perspective view of a laptop communication device 190 including multiple antenna modules 100, in accordance with various embodiments. In particular, FIG. 36 depicts an antenna module 100 having four antenna units 104 at either side of the keyboard of a laptop communication device 190. The antenna units 104 may occupy an area on the outside housing of the laptop communication device 190 that is approximately equal to or less than the area required for two adjacent Universal Serial Bus (USB) connectors (i.e., approximately 5 millimeters (height) by 22 millimeters (width) by 2.2 millimeters (depth)). The antenna module 100 of FIG. 37 may be tuned for operation in the housing (e.g., ABS plastic) of the device 190. In some embodiments, the antenna modules 100 in the device 190 may be tilted at a desired angle relative to the housing of the device 190.

An antenna module 100 included in a communication device (e.g., fixed wireless access devices) may include an antenna array having any desired number of antenna units 104 (e.g., 4×8 antenna units 104).

Any of the antenna modules 100 disclosed herein may include antenna boards 102 that have one or more narrowed portions that act as hinge(s) to allow the antenna module 100 to bend so that different sections of the antenna boards 102 are non-coplanar with each other. For example, FIGS. 38A and 38B illustrate antenna modules 100 having multiple IC packages 108 disposed on an antenna board 102 (e.g., in accordance with any of the embodiments disclosed herein). The antenna board 102 includes an antenna patch support 110 on which multiple antenna units 104 are disposed (e.g., in accordance with any of the embodiments disclosed herein) and which includes a narrowed portion 111. The material of the narrowed portion 111 may have adequate flexibility to allow the antenna patch support 110 to bend at the narrowed portion (e.g., from an initial configuration as shown in FIG. 38A to a bent configuration as shown in FIG. 38B) to a desired angle without significant damage to the antenna patch support 110. The antenna module 100 may be mounted in an electronic component (e.g., in the communication device 151) in its bent configuration (e.g., using any of the fixtures discussed above with reference to FIGS. 25-30 and 35-36), allowing the antenna units 104 on different sections of the antenna board 102 to radiate and receive at different angles, thereby increasing the range of coverage of the array of antenna units 104 relative to an embodiment in which the antenna units 104 are all mounted on a single plane of an antenna patch support 110.

In some embodiments, the narrowed portion 111 may be formed by sawing or otherwise cutting through an initial antenna patch support 110 until the desired thickness of the narrowed portion 111 is reached; in other embodiments, the antenna patch support 110 may be fabricated with the narrowed portion 111 without any sawing or cutting required. Although FIGS. 38A and 38B. illustrate a particular number of IC packages 180 and antenna units 104, this is simply for illustrative purposes, and any of the antenna boards 102 or antenna modules 100 disclosed herein may include one or more narrowed portions 111 to allow multiple sections of the antenna board 102 to be oriented at different angles.

Although various ones of the accompanying drawings have illustrated the antenna board 102 as having a larger footprint than the IC package 108, the antenna board 102 and the IC package 108 (which may be, e.g., an SiP) may have any suitable relative dimensions. For example, in some embodiments, the footprint of the IC package 108 in an antenna module 100 may be larger than the footprint of the antenna board 102. Such embodiments may occur, for example, when the IC package 108 includes multiple dies as the components 136. FIGS. 39-42 illustrate various examples of antenna modules 100 in which the footprint of the IC package 108 is larger than the footprint of an antenna board 102.

Figure 39:
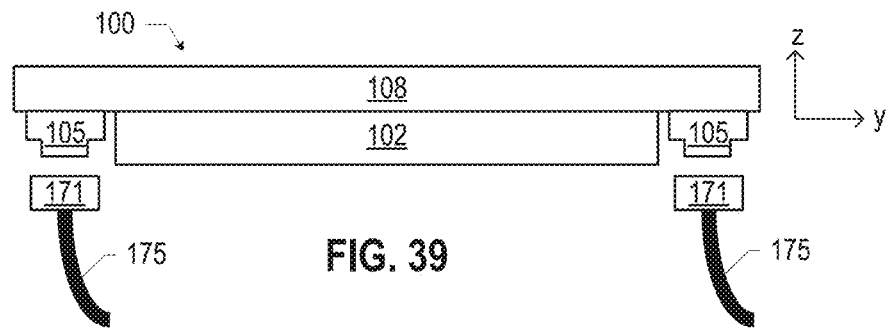
FIGS. 39-42 are side, cross-sectional views of example antenna modules, in accordance with various embodiments.

In the embodiment illustrated in FIG. 39, the face of the IC package 108 to which the antenna board is attached may also have multiple connectors 105 disposed thereon. These connectors 105 may extend past side faces of the antenna board 102, and may enable direct connection to the IC package 108 by cables 175 having connectors 171 that mate with the connectors 105. The connectors 105 of FIGS. 39-42 may take any suitable form (e.g., coaxial cable connectors, the flat cable connectors discussed below with reference to FIGS. 35 and 36, any of the other forms disclosed herein, etc.).

Figure 40:
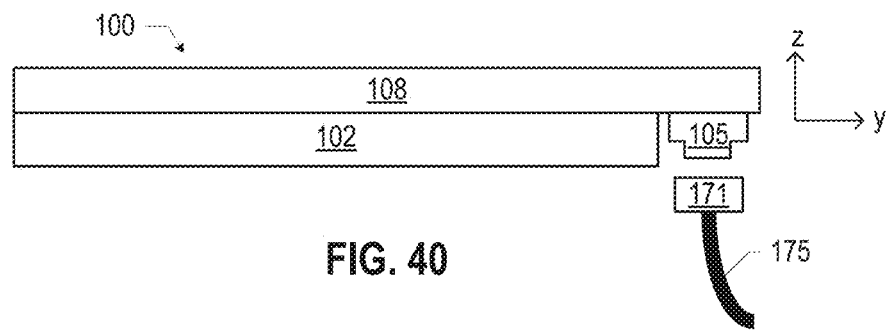

In the embodiment illustrated in FIG. 40, the antenna module 100 may have an asymmetric arrangement of the antenna board 102 and a connector 105. Generally, an antenna module 100 may include any suitable arrangement of connectors 105 on the IC package 108 and/or the antenna board 102 (as discussed above).

Figure 41:
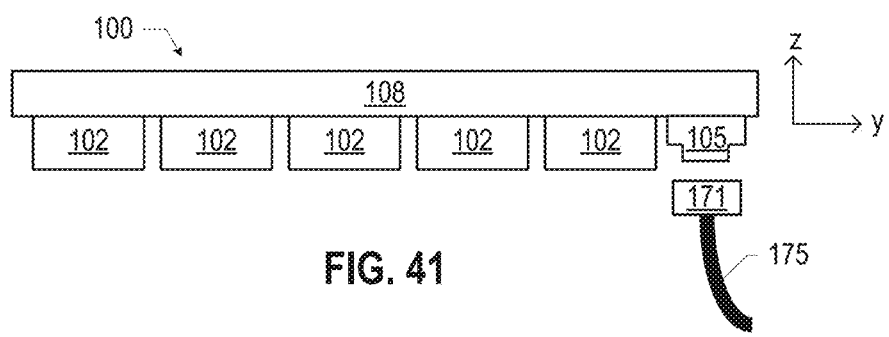

In some embodiments, an antenna module 100 may include multiple antenna boards 102. For example, FIG. 41 illustrates an embodiment in which multiple antenna boards 102 are coupled to a single IC package 108. FIG. 41 also illustrates a connector 105 on the bottom face of the IC package 108, but embodiments in which multiple antenna boards 102 are coupled to a single IC package 108 may include no connectors 105 on the IC package 108, or one or more connectors 105 on the IC package 108.

Figure 42:
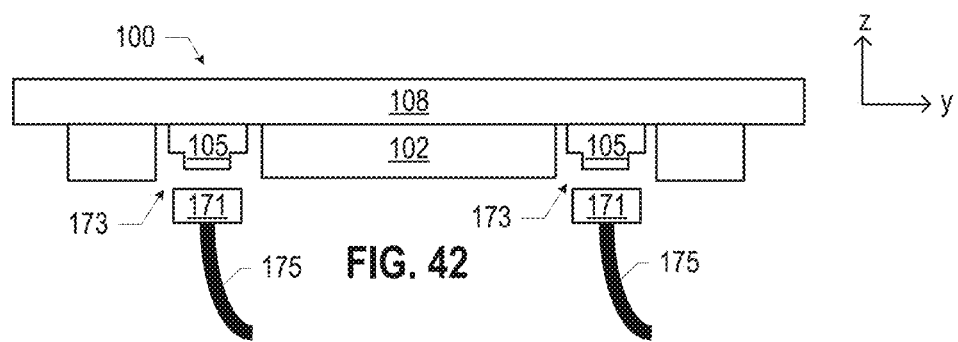

In some embodiments, an antenna board 102 may include holes through which connectors 105 on a face of the IC package 108 may be exposed, and cables 175 may couple to these connectors. For example, FIG. 42 illustrates an embodiment in which an antenna board 102 has one or more holes 173 therein; connectors 105 coupled to the bottom face of the IC package 108 may extend into the holes 173 (e.g., to couple with cables 175 with mating connectors 171). Although FIG. 42 illustrates an antenna module in which the antenna board 102 has a smaller footprint than the IC package 108, any of the antenna boards 102 disclosed herein may include holes 173 through which connectors 105 coupled to the IC package 108 may extend (e.g., antenna boards 102 having footprints that are larger than an IC package 108).

The antenna modules 100 disclosed herein may include, or be included in, any suitable electronic component. FIGS. 43-46 illustrate various examples of apparatuses that may include, or be included in, any of the antenna modules 100 disclosed herein.

Figure 43:
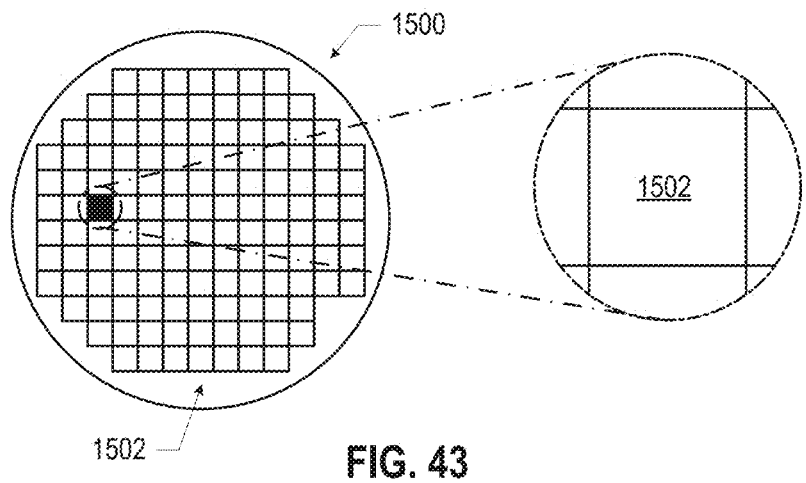
FIG. 43 is a top view of a wafer and dies that may be included in an antenna module, in accordance with any of the embodiments disclosed herein.

FIG. 43 is a top view of a wafer 1500 and dies 1502 that may be included in any of the antenna modules 100 disclosed herein. For example, a die 1502 may be included in an IC package 108 (e.g., as a component 136) or in an antenna unit 104. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 44, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 46) or other logic that is configured to store information in the memory devices or execute instructions stored in the memory array.

Figure 44:
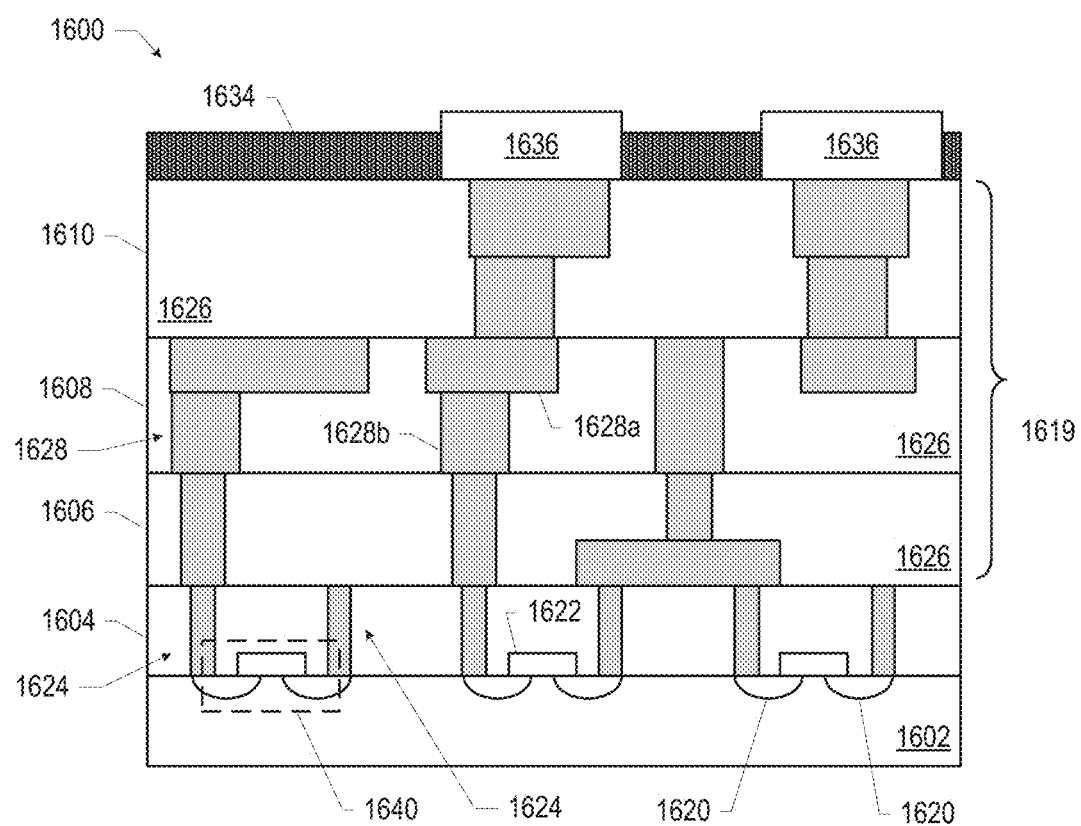
FIG. 44 is a side, cross-sectional view of an IC device that may be included in an antenna module, in accordance with any of the embodiments disclosed herein.

FIG. 44 is a side, cross-sectional view of an IC device 1600 that may be included in any of the antenna modules 100 disclosed herein. For example, an IC device 1600 may be included in an IC package 108 (e.g., as a component 136). The IC device 1600 may be formed on a substrate 1602 (e.g., the wafer 1500 of FIG. 43) and may be included in a die (e.g., the die 1502 of FIG. 43). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 43) or a wafer (e.g., the wafer 1500 of FIG. 43).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 44 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 44 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 44). Although a particular number of interconnect layers 1606-1610 is depicted in FIG. 44, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 44. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 44. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 44, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 45:
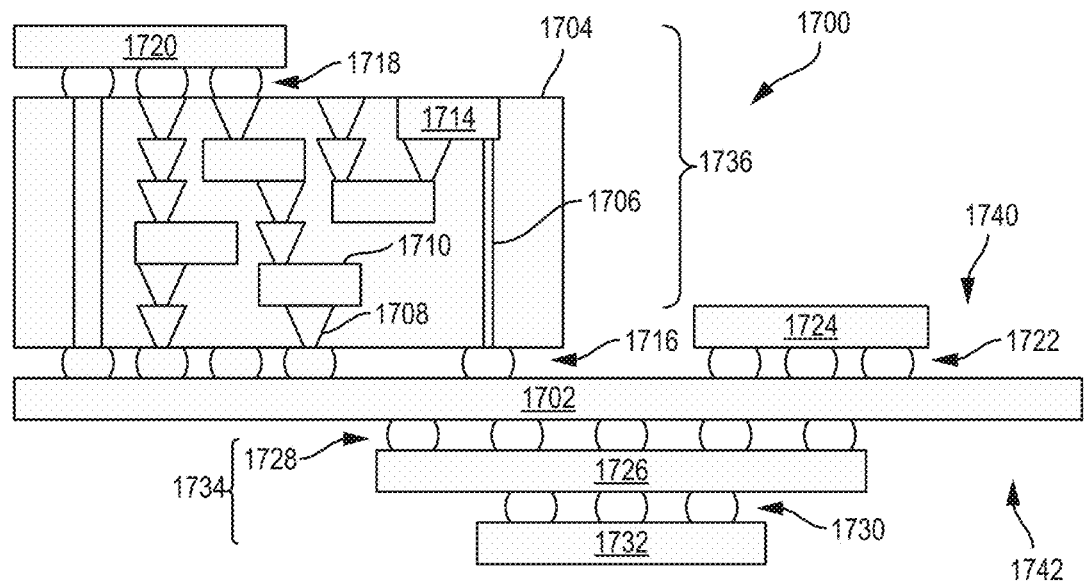
FIG. 45 is a side, cross-sectional view of an IC device assembly that may include an antenna module, in accordance with any of the embodiments disclosed herein.

FIG. 45 is a side, cross-sectional view of an IC device assembly 1700 that may include one or more of the antenna modules 100 disclosed herein. In particular, any suitable ones of the antenna modules 100 disclosed herein may take the place of any of the components of the IC device assembly 1700 (e.g., an antenna module 100 may take the place of any of the IC packages of the IC device assembly 1700).

The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 45 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 45), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 45, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 43), an IC device (e.g., the IC device 1600 of FIG. 44), or any other suitable component. Generally, the interposer 1704 may spread a connection to a wider pitch or reroute a connection to a different connection. For example, the interposer 1704 may couple the IC package 1720 (e.g., a die) to a set of ball grid array (BGA) conductive contacts of the coupling components 1716 for coupling to the circuit board 1702. In the embodiment illustrated in FIG. 45, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including but not limited to through-silicon vias (TSVs) 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 45 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 46:
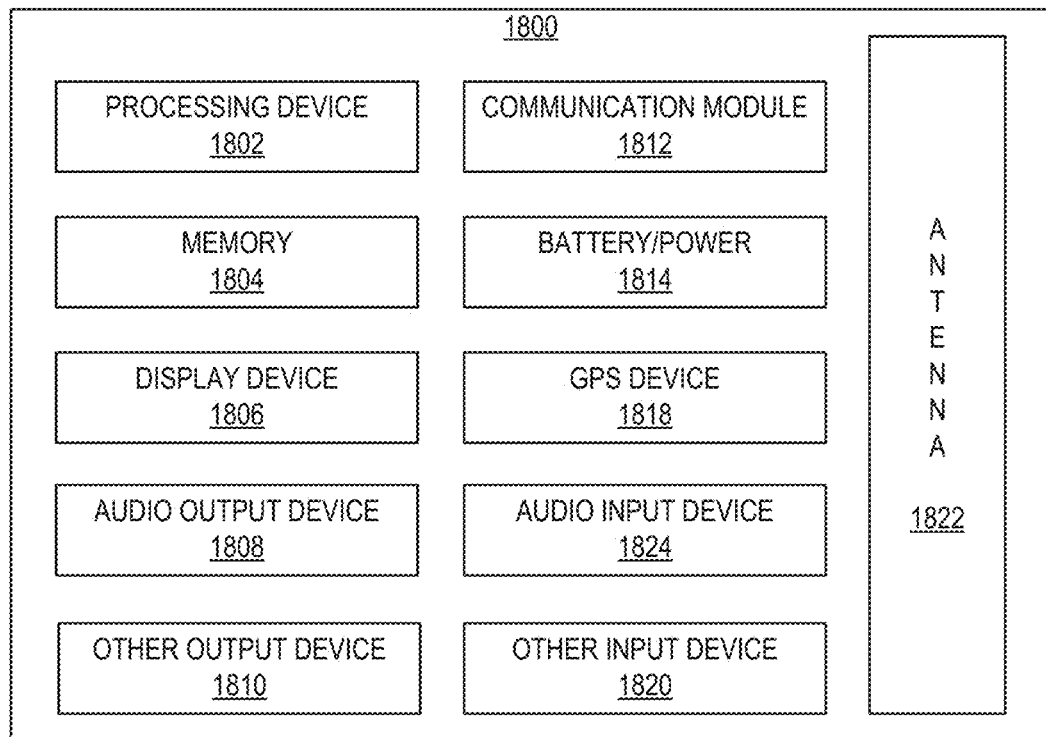
FIG. 46 is a block diagram of an example communication device that may include an antenna module, in accordance with any of the embodiments disclosed herein.

FIG. 46 is a block diagram of an example communication device 1800 that may include one or more antenna modules 100, in accordance with any of the embodiments disclosed herein. The communication device 151 (FIG. 24), the handheld communication device 198 (FIG. 36), and the laptop communication device 190 (FIG. 37) may be examples of the communication device 1800. Any suitable ones of the components of the communication device 1800 may include one or more of the IC packages 1650, IC devices 1600, or dies 1502 disclosed herein. A number of components are illustrated in FIG. 46 as included in the communication device 1800, but any one or more of these components may be omitted or duplicated, as suitable for the application. In some embodiments, some or all of the components included in the communication device 1800 may be attached to one or more motherboards. In some embodiments, some or all of these components are fabricated onto a single system-on-a-chip (SoC) die.

Additionally, in various embodiments, the communication device 1800 may not include one or more of the components illustrated in FIG. 46, but the communication device 1800 may include interface circuitry for coupling to the one or more components. For example, the communication device 1800 may not include a display device 1806, but may include display device interface circuitry (e.g., a connector and driver circuitry) to which a display device 1806 may be coupled. In another set of examples, the communication device 1800 may not include an audio input device 1824 or an audio output device 1808, but may include audio input or output device interface circuitry (e.g., connectors and supporting circuitry) to which an audio input device 1824 or audio output device 1808 may be coupled.

The communication device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The communication device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the communication device 1800 may include a communication module 1812 (e.g., one or more communication modules). For example, the communication module 1812 may be configured for managing wireless communications for the transfer of data to and from the communication device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not. The communication module 1812 may be, or may include, any of the antenna modules 100 disclosed herein.

The communication module 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication module 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication module 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication module 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication module 1812 may operate in accordance with other wireless protocols in other embodiments. The communication device 1800 may include an antenna 1822 to facilitate wireless communications and/or to receive other wireless communications (such as AM or FM radio transmissions).

In some embodiments, the communication module 1812 may manage wired communications, such as electrical, optical, or any other suitable communication protocols (e.g., the Ethernet). As noted above, the communication module 1812 may include multiple communication modules. For instance, a first communication module 1812 may be dedicated to shorter-range wireless communications such as Wi-Fi or Bluetooth, and a second communication module 1812 may be dedicated to longer-range wireless communications such as global positioning system (GPS), EDGE, GPRS, CDMA, WiMAX, LTE, EV-DO, or others. In some embodiments, a first communication module 1812 may be dedicated to wireless communications, and a second communication module 1812 may be dedicated to wired communications. In some embodiments, the communication module 1812 may include an antenna module 100 that supports millimeter wave communication.

The communication device 1800 may include battery/power circuitry 1814. The battery/power circuitry 1814 may include one or more energy storage devices (e.g., batteries or capacitors) and/or circuitry for coupling components of the communication device 1800 to an energy source separate from the communication device 1800 (e.g., AC line power).

The communication device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The communication device 1800 may include an audio output device 1808 (or corresponding interface circuitry, as discussed above). The audio output device 1808 may include any device that generates an audible indicator, such as speakers, headsets, or earbuds.

The communication device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The communication device 1800 may include a GPS device 1818 (or corresponding interface circuitry, as discussed above). The GPS device 1818 may be in communication with a satellite-based system and may receive a location of the communication device 1800, as known in the art.

The communication device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The communication device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The communication device 1800 may have any desired form factor, such as a handheld or mobile communication device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop communication device, a server or other networked computing component, a printer, a scanner, a monitor, a set-top box, an entertainment control unit, a vehicle control unit, a digital camera, a digital video recorder, or a wearable communication device. In some embodiments, the communication device 1800 may be any other electronic device that processes data.

The following paragraphs provide examples of various ones of the embodiments disclosed herein.

Example 1 is an electronic assembly, including: an antenna module, including: an integrated circuit (IC) package, wherein the IC package includes a die and a package substrate, the package substrate includes a first face and an opposing second face, the die is coupled to the first face of the package substrate, and the second face of the package substrate has a recess therein, and an antenna patch, coupled to the IC package, such that the antenna patch is over or at least partially in the recess.

Example 2 may include the subject matter of Example 1, and may further specify that an air cavity is present between the antenna patch and a bottom surface of the recess.

Example 3 may include the subject matter of any of Examples 1-2, and may further specify that the antenna patch is a first antenna patch, the antenna module further includes a second antenna patch, and the second antenna patch is between the first antenna patch and the IC package.

Example 4 may include the subject matter of Example 3, and may further specify that an air cavity is present between the first antenna patch and the second antenna patch.

Example 5 may include the subject matter of any of Examples 1-4, and may further specify that the antenna patch is coupled to an antenna patch support, and the antenna patch support is coupled to the IC package.

Example 6 may include the subject matter of Example 5, and may further specify that the antenna patch is coupled to the antenna patch support by solder or an adhesive.

Example 7 may include the subject matter of Example 5, and may further specify that the antenna patch is part of a metallization layer in the antenna patch support.

Example 8 may include the subject matter of Example 5, and may further specify that the antenna patch is secured in a recess of the antenna patch support.

Example 9 may include the subject matter of Example 8, and may further specify that the antenna patch is secured in the recess of the antenna patch support by an adhesive.

Example 10 may include the subject matter of any of Examples 5-9, and may further specify that the antenna patch support includes an air cavity between the antenna patch and the IC package.

Example 11 may include the subject matter of Example 10, and may further specify that the antenna patch is a first antenna patch, the antenna module further includes a second antenna patch, and the air cavity is between the first antenna patch and the second antenna patch.

Example 12 may include the subject matter of any of Examples 5-11, and may further specify that the antenna patch support includes eight or fewer printed circuit board layers.

Example 13 may include the subject matter of any of Examples 5-12, and may further specify that the antenna patch support includes a printed circuit board.

Example 14 may include the subject matter of any of Examples 5-13, and may further specify that the IC package is coupled to the antenna patch support by solder.

Example 15 may include the subject matter of any of Examples 1-14, and may further specify that the antenna module includes at least four antenna patches.

Example 16 may include the subject matter of Example 15, and may further specify that the antenna patches are arranged in a linear array, and at least one of the antenna patches is rotationally offset from the linear array.

Example 17 may include the subject matter of Example 16, and may further specify that the at least one of the antenna patches is rotationally offset from the linear array in a z-direction.

Example 18 may include the subject matter of any of Examples 1-17, and may further specify that the IC package is a first IC package, and the antenna module further includes a second IC package.

Example 19 may include the subject matter of any of Examples 1-18, and may further specify that a height of the antenna module is less than 3 millimeters.

Example 20 may include the subject matter of any of Examples 1-19, and may further specify that the antenna patch is a millimeter wave antenna patch.

Example 21 may include the subject matter of any of Examples 1-20, and may further include a display.

Example 22 may include the subject matter of any of Examples 1-21, and may further specify that the electronic assembly is a handheld communication device.

Example 23 may include the subject matter of any of Examples 1-21, and may further specify that the electronic assembly is a router.

Example 24 is a method of manufacturing an antenna board, including: forming a recess in a first face of a printed circuit board; laminating a layer of dielectric material to the first face over the recess; coupling a first antenna patch to the layer of dielectric material, such that the first antenna patch is over the recess after the layer of dielectric material is laminated to the first face; coupling a second antenna patch to a second face of the printed circuit board, wherein the second face of the printed circuit board is opposite to the first face of the printed circuit board, and the second antenna patch is over the recess; and forming openings in the layer of dielectric material and in the second face of the printed circuit board such that, after the layer of dielectric material is laminated to the first face and the openings are formed, the openings are in fluid communication with the recess.

Example 25 may include the subject matter of Example 24, and may further specify that the openings are formed by laser drilling.

Example 26 may include the subject matter of any of Examples 24-25, and may further specify that the recess has a depth between 100 microns and 500 microns.

Example 27 may include the subject matter of any of Examples 24-26, and may further specify that the second antenna patch is coupled to the second face of the printed circuit board prior to laminating the layer of dielectric material to the first face over the recess.

Example 28 is a communication device, including: a display; a back cover; and an antenna module between the display and the back cover, wherein the antenna module includes: an integrated circuit (IC) package, wherein the IC package includes a die and a package substrate, and the package substrate has a recess therein, and an antenna patch, coupled to the package substrate, such that the antenna patch is over or at least partially in the recess.

Example 29 may include the subject matter of Example 28, and may further specify that an air cavity is present between the antenna patch and a bottom surface of the recess.

Example 30 may include the subject matter of any of Examples 28-29, and may further specify that the antenna patch is a first antenna patch, the antenna module further includes a second antenna patch, and the second antenna patch is between the first antenna patch and the package substrate.

Example 31 may include the subject matter of Example 30, and may further specify that an air cavity is present between the first antenna patch and the second antenna patch.

Example 32 may include the subject matter of any of Examples 28-30, and may further specify that the antenna patch is coupled to an antenna patch support, and the antenna patch support is coupled to the package substrate.

Example 33 may include the subject matter of Example 32, and may further specify that the antenna patch is coupled to the antenna patch support by solder or an adhesive.

Example 34 may include the subject matter of Example 32, and may further specify that the antenna patch is part of a metallization layer in the antenna patch support.

Example 35 may include the subject matter of Example 32, and may further specify that the antenna patch is secured in a recess of the antenna patch support.

Example 36 may include the subject matter of Example 35, and may further specify that the antenna patch is secured in the recess of the antenna patch support by an adhesive.

Example 37 may include the subject matter of any of Examples 32-36, and may further specify that the antenna patch support includes an air cavity between the antenna patch and the IC package.

Example 38 may include the subject matter of Example 37, and may further specify that the antenna patch is a first antenna patch, the antenna module further includes a second antenna patch, and the air cavity is between the first antenna patch and the second antenna patch.

Example 39 may include the subject matter of any of Examples 32-38, and may further specify that the antenna patch support includes eight or fewer printed circuit board layers.

Example 40 may include the subject matter of any of Examples 32-39, and may further specify that the antenna patch support includes a printed circuit board.

Example 41 may include the subject matter of any of Examples 32-40, and may further specify that the IC package is coupled to the antenna patch support by solder.

Example 42 may include the subject matter of any of Examples 28-41, and may further specify that the antenna module includes at least four antenna patches.

Example 43 may include the subject matter of Example 42, and may further specify that the antenna patches are arranged in a linear array, and at least one of the antenna patches is rotationally offset from the linear array.

Example 44 may include the subject matter of Example 43, and may further specify that the at least one of the antenna patches is rotationally offset from the linear array in a z-direction.

Example 45 may include the subject matter of any of Examples 28-44, and may further specify that the IC package is a first IC package, and the antenna module further includes a second IC package.

Example 46 may include the subject matter of any of Examples 28-45, and may further specify that a height of the antenna module is less than 3 millimeters.

Example 47 may include the subject matter of any of Examples 28-46, and may further specify that the antenna patch is a millimeter wave antenna patch.

Example 48 may include the subject matter of any of Examples 28-47, and may further specify that the communication device is a handheld communication device.

Example 49 may include the subject matter of any of Examples 28-48, and may further specify that an air cavity is present between the antenna module and the back cover.

Example 50 may include the subject matter of any of Examples 28-49, and may further specify that an air cavity is present between the antenna module and the display.

Example 51 is an antenna module, including: an integrated circuit (IC) package, wherein the IC package includes a die and a package substrate, and the package substrate has a recess therein; and an antenna patch, coupled to the package substrate, such that the antenna patch is over or at least partially in the recess.

Example 52 may include the subject matter of Example 51, and may further specify that an air cavity is present between the antenna patch and a bottom surface of the recess.

The invention claimed is:

1. An electronic assembly, comprising:
   an antenna module, including:
      an integrated circuit (IC) package, wherein the IC package includes a die coupled to a package substrate;
      an antenna patch support coupled to the package substrate on a side of the package substrate opposite to the die, wherein the antenna patch support includes a first surface and an opposing second surface, the package substrate is coupled to the first surface and the second surface has a plurality of recesses therein; and
      a plurality of antenna patches coupled to the antenna patch support, wherein at least some antenna patches in the plurality of antenna patches are over corresponding ones of the plurality of recesses.

2. The electronic assembly of claim 1, wherein:
   the plurality of antenna patches is coupled to the antenna patch support by solder or an adhesive, and
   the plurality of antenna patches is part of a metallization layer in the antenna patch support.

3. The electronic assembly of claim 1, wherein the antenna patch support includes a printed circuit board.

4. The electronic assembly of claim 1, wherein the IC package is coupled to the antenna patch support by solder.

5. The electronic assembly of claim 1, wherein:
   the plurality of recesses is a first plurality of recesses,
   the antenna patch support includes a second plurality of recesses, and
   each one of the second plurality of recesses is between adjacent pairs in the first plurality of recesses.

6. The electronic assembly of claim 1, wherein: the package substrate includes an air cavity between the plurality of antenna patches and the die.

7. The electronic assembly of claim 6, wherein the plurality of antenna patches is a first plurality of antenna patches, the antenna module further includes a second plurality of antenna patches, and the air cavity is between the first plurality of antenna patches and the second plurality of antenna patches.

8. A communication device, comprising:
   a circuit board having a first surface and an opposing second surface;
   an antenna module coupled to the first surface of the circuit board;
   at least one package substrate coupled to the second surface of the circuit board;
   a plurality of antenna patches in the antenna module;
   a display; and
   a chassis having a window,
   wherein:
      the chassis is proximate to the first surface of the circuit board,
      a first air gap separates the chassis from the first surface of the circuit board,
      the plurality of antenna patches is aligned with the window of the chassis,
      the display is proximate to the second surface of the circuit board, and
      a second air gap separates the display from the second surface of the circuit board.

9. The communication device of claim 8, further comprising another plurality of antenna patches and a keyboard, wherein the another plurality of antenna patches is coupled to either side of the keyboard.

10. The communication device of claim 8, wherein the communication device is a handheld device.

11. The communication device of claim 8, wherein the communication device is a laptop.

12. The communication device of claim 8, further comprising a back cover having an inner face and an outer face, wherein the chassis is directly coupled to the inner face of the back cover.

13. An electronic assembly, comprising:
an antenna module, including:
an integrated circuit (IC) package, wherein the IC package includes a die and a package substrate, the package substrate includes a first face and an opposing second face, the die is coupled to the first face of the package substrate, and the second face of the package substrate has a recess therein, and
a first antenna patch and a second antenna patch coupled to the IC package, wherein the first antenna patch is over or at least partially in the recess, the second antenna patch is between the first antenna patch and the package substrate, and a cavity comprising a gas is present between the first antenna patch and the second antenna patch.

14. The electronic assembly of claim 13, wherein the first antenna patch is coupled to an antenna patch support, and the antenna patch support is coupled to the IC package.

15. The electronic assembly of claim 14, wherein the first antenna patch is coupled to the antenna patch support by solder or an adhesive or the first antenna patch is part of a metallization layer in the antenna patch support.

16. The electronic assembly of claim 14, wherein the first antenna patch is in a recess of the antenna patch support.

17. The electronic assembly of claim 14, wherein the antenna patch support includes a gas cavity between the first antenna patch and the IC package.

18. The electronic assembly of claim 17, wherein the gas cavity is between the first antenna patch and the second antenna patch.

19. The electronic assembly of claim 14, wherein the antenna patch support includes a printed circuit board.

20. The electronic assembly of claim 14, wherein the IC package is coupled to the antenna patch support by solder.

* * * * *